(12) United States Patent
Zhou et al.

(10) Patent No.: US 12,136,609 B2
(45) Date of Patent: *Nov. 5, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Haohua Zhou, Fremont, CA (US); Mei Hsu Wong, Saratoga, CA (US); Tze-Chiang Huang, Saratoga, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/344,282

(22) Filed: Jun. 29, 2023

(65) Prior Publication Data
US 2023/0343754 A1    Oct. 26, 2023

Related U.S. Application Data

(63) Continuation of application No. 17/135,312, filed on Dec. 28, 2020, now Pat. No. 11,735,565.

(60) Provisional application No. 63/059,234, filed on Jul. 31, 2020.

(51) Int. Cl.
| H01L 25/065 | (2023.01) |
| H01L 23/525 | (2006.01) |
| H03K 5/24 | (2006.01) |
| H03K 19/20 | (2006.01) |

(52) U.S. Cl.
CPC ...... *H01L 25/0657* (2013.01); *H01L 23/5256* (2013.01); *H03K 5/24* (2013.01); *H03K 19/20* (2013.01); *H01L 2225/06513* (2013.01); *H01L 2225/06527* (2013.01); *H01L 2225/06541* (2013.01)

(58) Field of Classification Search
None
See application file for complete search history.

(56) References Cited

U.S. PATENT DOCUMENTS

| 8,928,399 | B2 | 1/2015 | Koyanagi |
| 10,014,038 | B2 | 7/2018 | Morohashi |
| 10,608,633 | B1 | 3/2020 | Schreiber |
| 11,735,565 | B2 * | 8/2023 | Zhou ............. H01L 23/5256 327/565 |
| 2009/0052267 | A1 | 2/2009 | Kao |
| 2009/0185434 | A1 | 7/2009 | Pyeon |
| 2010/0315887 | A1 | 12/2010 | Park |
| 2011/0079923 | A1 | 4/2011 | Suh |
| 2011/0093224 | A1 | 4/2011 | Ide et al. |
| 2012/0124408 | A1 | 5/2012 | Byeon et al. |
| 2014/0141543 | A1 | 5/2014 | Ide et al. |

(Continued)

*Primary Examiner* — Cassandra F Cox
(74) *Attorney, Agent, or Firm* — Slater Matsil, LLP

(57) ABSTRACT

A plurality of semiconductor devices are arranged in a stack. Individual semiconductor devices within the stack are selected by an identity signal sent into the stack. The signal is compared within each stack to a unique stack identifier stored within each of the semiconductor devices and, when the signal is the same as the unique stack identifier, the semiconductor device is selected while, when the signal is not the same as the unique stack identifier, the semiconductor device remains within the default bypass mode.

20 Claims, 17 Drawing Sheets

(56) References Cited

U.S. PATENT DOCUMENTS

| | | |
|---|---|---|
| 2014/0306753 A1 | 10/2014 | Jeong |
| 2015/0179240 A1 | 6/2015 | Johnson |
| 2017/0125119 A1 | 5/2017 | Loh et al. |
| 2019/0165791 A1 | 5/2019 | Vandebriel et al. |
| 2019/0198479 A1 | 6/2019 | Chiu et al. |
| 2019/0279963 A1 | 9/2019 | Woo et al. |
| 2020/0168595 A1 | 5/2020 | Chang et al. |

* cited by examiner

SEMICONDUCTOR DEVICE AND METHOD OF MANUFACTURE

PRIORITY CLAIM AND CROSS-REFERENCE

This application is a continuation of U.S. patent application Ser. No. 17/135,312, filed on Dec. 28, 2020, entitled "Semiconductor Device and Method of Manufacture," which claims the benefit of U.S. Provisional Application No. 63/059,234, filed on Jul. 31, 2020, which applications are hereby incorporated herein by reference.

BACKGROUND

Conventionally, integrated circuit chips are interconnected using so-called two dimensional, or 2D, connections. For advanced devices, such as system on chip (SoC) devices having large layouts with numerous functional blocks (e.g., logic, I/O, memory, analog circuits, and the like) conventional 2D wiring has numerous limitations. These include I/O limitations because of the large number of interconnects and I/O ports required, power consumption/current leakage associated with 2D wiring, and high costs associated with the 2D wiring. These problems are exacerbated as technology nodes advance to the sub-micron scale. Conventional 2D wiring causes yield challenges as well, particularly for advanced node devices, such as field programmable gate arrays (FPGAs) and graphic processing units (GPUs).

So-called 3D wiring, which includes interconnecting multiple chips vertically as well as horizontally on a common substrate, is increasingly desirable for advanced devices. Printed circuit boards and/or silicon interposer packages may be employed to interconnect different integrated circuits, such as an advanced logic device and associated memory, such as a DRAM chip. The use of through silicon vias (TSVs) also aids more efficient packaging with 3D packages and allows for wider I/O connections. Such packages open the door for package on package (PoP) devices, such as a DRAM package stacked atop a logic package. Despite the advantage, other challenges exist in packaging and particularly 3D packaging, as well, including the need for appropriate or more efficient sending and/or receiving of data in 3D stacks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
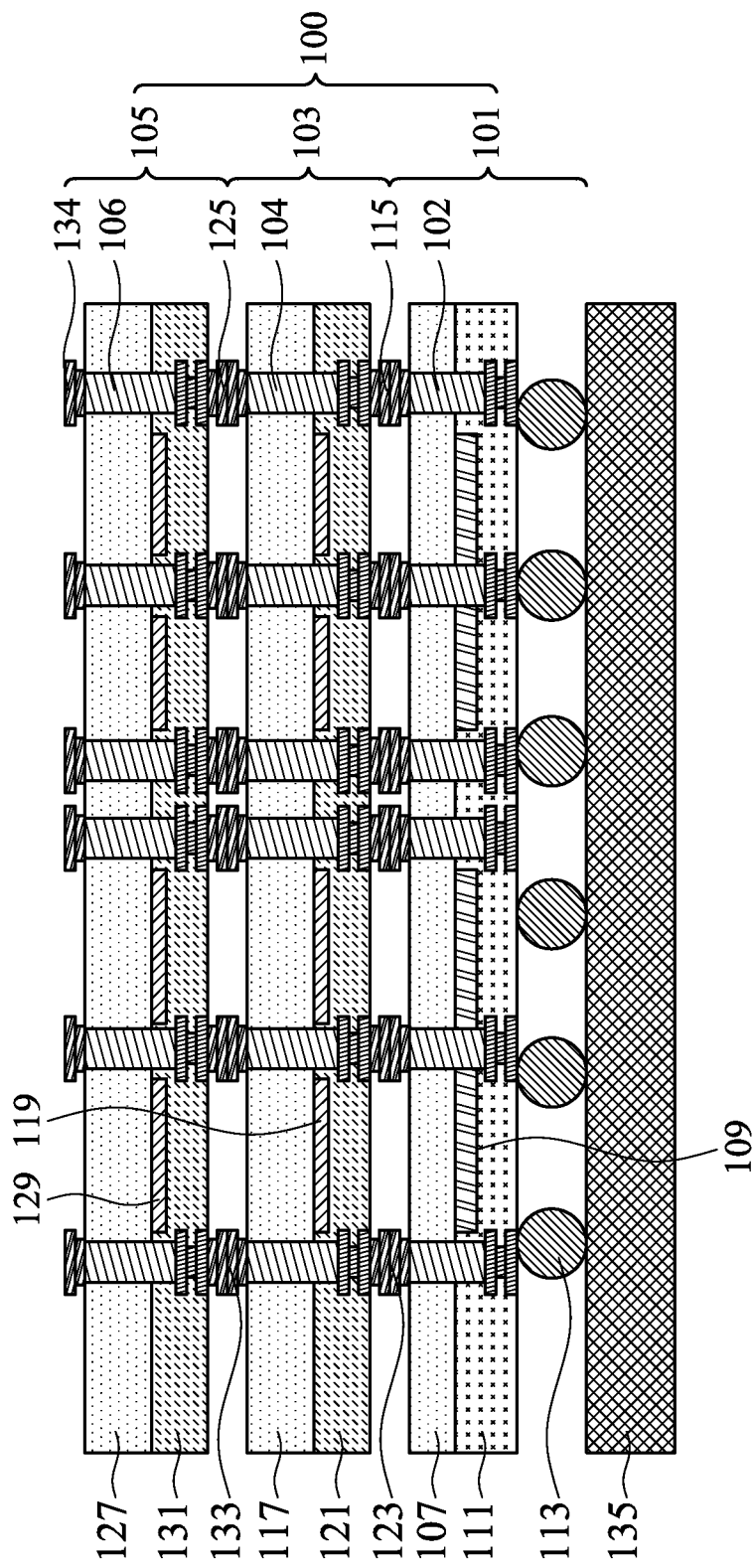
FIG. 1 illustrates a stack of semiconductor devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees, 180 degrees, or at other orientations) and the spatially relative descriptors used herein may likewise be interpreted accordingly.

Embodiments will now be described with respect to a particular embodiment in which a stack of semiconductor devices sends and receives data signals using unique identifiers that signify each semiconductor device's location within the stack. The embodiments presented herein, however, are not limited to the precise embodiments described herein, and the embodiments may be implemented in a wide variety of devices and methods.

With respect now to FIG. 1, there is illustrated a first stack 100 of semiconductor devices, including a first semiconductor device 101, a second semiconductor device 103, and a third semiconductor device 105. In an embodiment the first semiconductor device 101, the second semiconductor device 103, and the third semiconductor device 105 may be any suitable semiconductor die such as a logic die, a memory die, a field programmable gate array (FPGA) die, I/O die, analog die, or the like. However, any suitable type of semiconductor die may be utilized.

In an embodiment the first semiconductor device 101 comprises a first semiconductor substrate 107, first through substrate vias (TSVs) 102, first active devices (represented in FIG. 1 by a square labeled 109) within an active region of the first semiconductor substrate 107, and first metallization layers 111. In an embodiment the first semiconductor substrate 107 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Within the first semiconductor substrate 107, the first TSVs 102 may be formed to extend through the first semiconductor substrate 107 so as to provide a quick passage of data signals from a first side of the first semiconductor substrate 107 to a second side of the first semiconductor substrate 107 in order to send the data signals to an overlying semiconductor device (e.g., the second semiconductor device 103 and/or the third semiconductor device 105). In an embodiment the first TSVs 102 may be formed by initially forming through silicon via (TSV) openings into the first semiconductor substrate 107. The TSV openings may be formed by applying and developing a suitable photoresist, and removing portions of the first semiconductor substrate 107 that are exposed to a desired depth. The TSV openings may be formed so as to extend into the first semiconductor substrate 107 to a depth greater than the eventual desired height of the first semiconductor substrate 107. Accordingly, while the depth is dependent upon the overall designs, the depth may be between about 20 µm and about 200 µm, such as a depth of about 50 µm.

Once the TSV openings have been formed within the first semiconductor substrate 107, the TSV openings may be lined with a liner. The liner may be, e.g., an oxide formed from tetraethylorthosilicate (TEOS) or silicon nitride, although any suitable dielectric material may be used. The liner may be formed using a plasma enhanced chemical vapor deposition (PECVD) process, although other suitable processes, such as physical vapor deposition or a thermal process, may be used. Additionally, the liner may be formed to a thickness of between about 0.1 µm and about 5 µm, such as about 1 µm.

Once the liner has been formed along the sidewalls and bottom of the TSV openings, a barrier layer may be formed and the remainder of the TSV openings may be filled with a first conductive material. The first conductive material may comprise copper, although other suitable materials such as aluminum, alloys, doped polysilicon, combinations thereof, and the like, may be utilized. The first conductive material may be formed by electroplating copper onto a seed layer, filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Once the TSV openings have been filled, a thinning of a second side of the first semiconductor substrate 107 in order to expose the openings for the first TSVs 102 and form the first TSVs 102 from the conductive material that extends through the first semiconductor substrate 107. The thinning of the second side of the substrate may be performed by a planarization process such as CMP or etching. However, any suitable method of forming the first TSVs 102 may be utilized.

The first semiconductor substrate 107 may also include first active devices 109. As one of ordinary skill in the art will recognize, a wide variety of first active devices 109 and passive devices such as transistors, capacitors, resistors, combinations of these, and the like may be used to generate the desired structural and functional requirements of the design for the first semiconductor device 101 (as described further below). The first active devices 109 may be formed using any suitable methods.

The first semiconductor device 101 additionally comprises back end of line (BEOL) first metallization layers 111. The first metallization layers 111 are formed over the first semiconductor substrate 107 and the first active devices 109 and are designed to connect the various active devices 109 and the first TSVs 102 to form functional circuitry. In an embodiment the first metallization layers 111 are formed of alternating layers of dielectric and conductive material and may be formed through any suitable process (such as deposition, damascene, dual damascene, etc.) in order to form conductive lines and conductive vias. The precise number of first metallization layers 111 is dependent upon the design of the first semiconductor device 101.

In a particular embodiment each of the layers of the first metallization layers 111 may be formed using a damascene or dual damascene process. For example, a dielectric layer may be deposited over the structure and a photoresist may be placed over the dielectric layer. Once in place, the photoresist may be patterned by passing an energy source (e.g., light) through a mask in order to form a patterned energy source, and the patterned energy source is then directed towards and impacts the photoresist. Once the patterned energy source has impacted the photoresist, the photoresist is developed using a developer in order to separate and remove either the exposed or unexposed portions of the photoresist. The patterned photoresist is then utilized as a mask to form an opening either through or within the dielectric layer.

Once the opening has been formed either through or within the dielectric layer, a conductive material may be placed into the opening. In a particular embodiment, a seed layer is initially deposited, and then a deposition method such as electrical plating or electroless plating is utilized to fill and or overfill the opening with conductive material. Once in place, any excess material of the conductive material that is located outside of the opening may be removed using a planarization process, such as a chemical mechanical planarization process. However, any suitable methods may be utilized to form the conductive lines and vias of each layer of the first metallization layers 111.

First external connections 113 may be formed in electrical connection with the first metallization layers 111. In an embodiment the first external connections 113 may be a conductive pillar, such as a copper pillar, and may comprise one or more conductive materials, such as copper, tungsten, other conductive metals, or the like, and may be formed, for example, by electroplating, electroless plating, or the like with a seed layer and a placed and patterned photoresist. In an embodiment, an electroplating process is used wherein the seed layer and the photoresist are submerged or immersed in an electroplating solution such as a copper sulfate ($CuSO_4$) containing solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist. Once formed, the photoresist may be removed and the underlying exposed seed layer may be removed.

In another embodiment, the first external connections 113 may be contact bumps such as microbumps or controlled collapse chip connection (C4) bumps and may comprise a material such as tin, or other suitable materials, such as silver or copper. In an embodiment in which the first external connections 113 are contact bumps, the first external connections 113 may comprise a material such as tin, or other suitable materials, such as silver, lead-free tin, or copper. In an embodiment in which the first external connections 113 is a tin solder bump, the first external connections 113 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape.

Additionally, second external connectors 115 may be formed to provide conductive regions for contact between the first semiconductor device 101 and, e.g., the second semiconductor device 103. In an embodiment the second external connectors 115 may be a hybrid bump formation comprising any desired numbers and any desired combinations of ball grid array (BGA) connectors, solder balls, controlled collapse chip connection (C4) bumps, micro bumps (e.g., pbumps), electroless nickel-electroless palladium-immersion gold technique (ENEPIG) formed bumps, or the like. However, any suitable types of external connectors may be utilized.

In an embodiment the second external connectors 115 may be conductive pillars and may be formed by initially forming a photoresist (not shown) over the back side of the first semiconductor device 101. The photoresist may be patterned in the desired shape of the second external connectors 115. The second external connectors 115 are then deposited within the photoresist from a conductive material such as copper, although other conductive materials such as nickel, gold, or metal alloy, combinations of these, or the like may also be used. Additionally, the second external connectors 115 may be formed using a process such as electroplating or electroless plating. The process deposits, e.g., copper, within the openings in order to fill and/or overfill the openings of the photoresist, thereby forming the second external connectors 115. Excess conductive material and photoresist outside of the openings of the first passivation layer may then be removed using, for example, an ashing process, a chemical mechanical polish (CMP) process, combinations of these, or the like.

However, as one of ordinary skill in the art will recognize, the above described process to form the first external connections 113 and the second external connectors 115 is merely one such description, and is not meant to limit the embodiments to this exact process. Rather, the described processes are intended to be merely illustrative, as any suitable process or combination of processes for forming the first external connections 113 and the second external connectors 115 may be utilized. All suitable processes are fully intended to be included within the scope of the present embodiments.

The second semiconductor device 103 may be similar to the first semiconductor device 101 (both as already described and also as subsequently described herein). For example, the second semiconductor device 103 may comprise a second semiconductor substrate 117, second TSVs 104, second active devices 119, a back end of line second metallization layer 121, and fourth external connectors 125, which may be similar to the first semiconductor substrate 107, the first TSVs 102, the first active devices 109, the first metallization layers 111, and the second external connectors 115, respectively. Additionally, the second semiconductor device 103 may comprise third external connectors 123 which may be similar to either the first external connections 113 and/or the second external connectors 115.

The third semiconductor device 105 may be similar to the first semiconductor device 101 (both as already described and also as subsequently described herein). For example, the third semiconductor device 105 may comprise a third semiconductor substrate 127, third TSVs 106, third active devices 129, back end of line third metallization layers 131, fifth external connectors 133, and sixth external connectors 134 which may be similar to the first semiconductor substrate 107, the first TSVs 102, the first active devices 109, the first metallization layers 111, the third external connectors 123, and the fourth external connectors 125, respectively.

In an embodiment the third semiconductor device 105 is bonded to the second semiconductor device 103, and the second semiconductor device 103 is bonded to the first semiconductor device 101. In an embodiment the front sides of the second semiconductor device 103 and the third semiconductor device 105 are bonded to the front side of the first semiconductor device 101 and the back side of the second semiconductor device 103 in a face-to-back configuration, while the front side of the second semiconductor device 103 is bonded to the front side of the first semiconductor device 101 in a face-to-face configuration. However, in other embodiments the first semiconductor device 101, the second semiconductor device 103, and the third semiconductor device 105 may be bonded in any suitable combination of orientations. Any suitable configurations may be utilized.

For example, in an embodiment in which the fifth external connectors 133 and the fourth external connectors 125 are both copper pillars, the fifth external connectors 133 and the fourth external connectors 125 are aligned with each other and then placed into physical contact. Once in physical contact, the fifth external connectors 133 and the fourth external connectors 125 are heated and pressure is applied in order to form a metal-to-metal bond. However, any other suitable bonding processes, such as dielectric-to-dielectric bonding (using, e.g., passivation layers not illustrated in FIG. 1), hybrid bonding, or the like, may be utilized.

Similarly, in an embodiment in which the second external connectors 115 and the third external connectors 123 are both copper pillars, the second external connectors 115 and the third external connectors 123 are aligned with each other and then placed into physical contact. Once in physical contact, the second external connectors 115 and the third external connectors 123 are heated and pressure is applied in order to form a metal-to-metal bond. However, any other suitable bonding processes, such as dielectric-to-dielectric bonding, hybrid bonding, or the like, may be utilized In an embodiment, the first semiconductor device 101, either before or after the bonding to the second semiconductor device 103, is bonded to a support substrate 135. In an embodiment the support substrate 135 may be a package substrate or a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may be utilized, and all such redistributive substrates that provide support and connectivity to the structure including the first external connections 113 are fully intended to be included within the scope of the embodiments.

In an embodiment in which the first external connections 113 are solder bumps, the first external connections 113 may be aligned with corresponding connections of the support substrate 135. Once aligned and in physical contact, a reflow process may be performed in order reflow the material of the first external connections 113 and bond the first external connections 113 with the support substrate 135. However, any suitable bonding process may be utilized.

Figure 2:
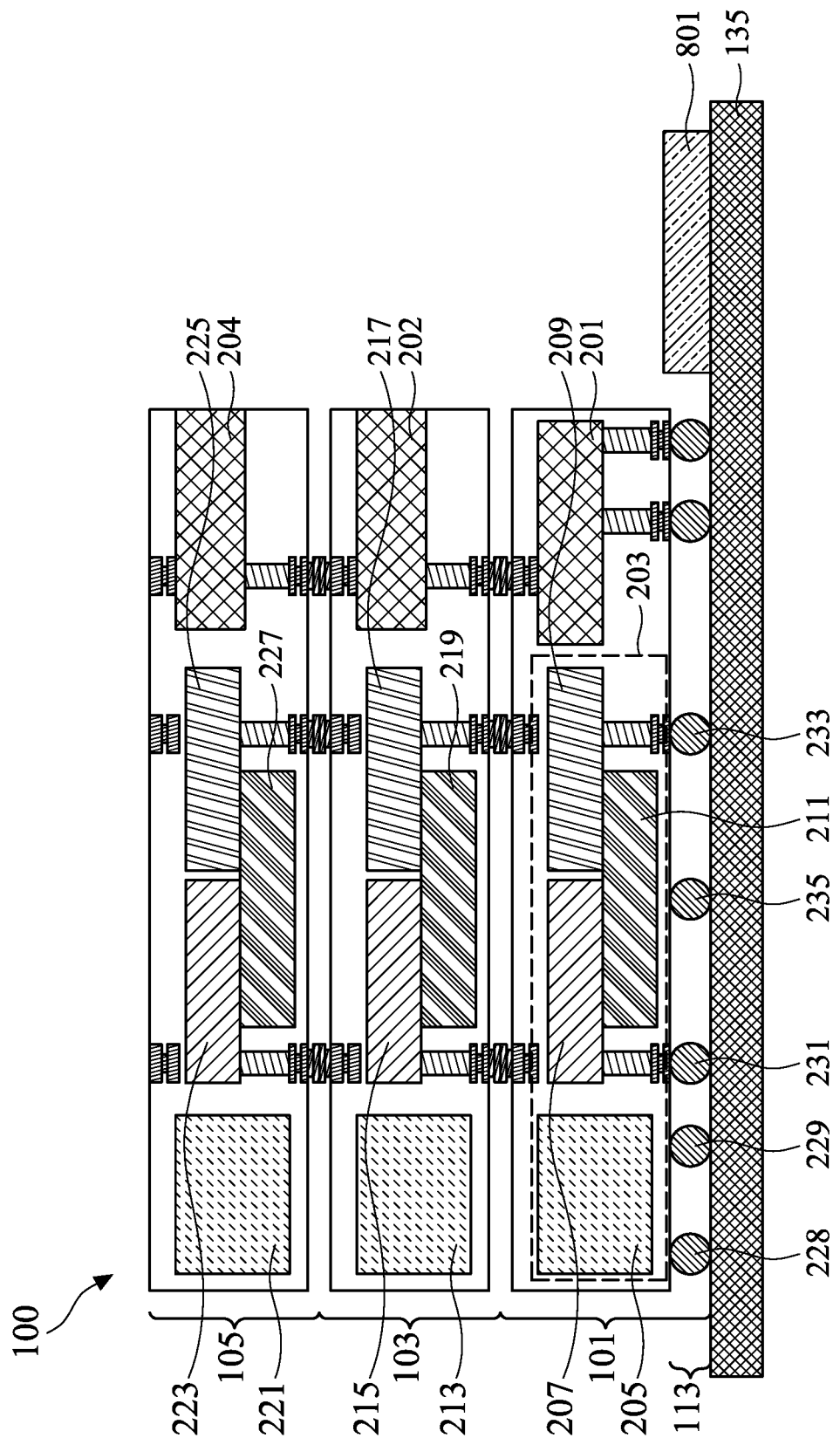
FIG. 2 illustrates a conceptual view of the stack of semiconductor devices, in accordance with some embodiments.

FIG. 2 illustrates the first semiconductor device 101, the second semiconductor device 103, and the third semiconductor device 105 in a stacked arrangement on the support substrate 135 with a first control block 801 to form the first stack 100. FIG. 2, however, illustrates conceptual concepts of circuitry within each of the first semiconductor device 101, the second semiconductor device 103, and the third semiconductor device 105. For example, looking first at the first semiconductor device 101, the first semiconductor device may comprise a first active circuit 201 along with a first I/O region 203. In an embodiment the active circuitry may comprise logic circuits, memory circuits, combinations of these, or the like, which provides the desired functionality of the first semiconductor device 101. However, any suitable circuitry may be utilized.

The first I/O region 203 is utilized to send and receive signals into and out of the first semiconductor device 101 (e.g., into and out of the first active circuit 201) to and from both the support substrate 135 and the second semiconductor device 103. In an embodiment the first I/O region 203 comprises a first ID block 205, a first output block 207, a first input block 209, and a first inout block 211. However, any other suitable blocks may be utilized.

The second semiconductor device 103 and the third semiconductor device 105 may comprise identical structures as the first semiconductor device 101. For example, the second semiconductor device 103 comprises a second active circuits 202, a second ID block 213, a second output block 215, a second input block 217, and a second inout block 219 which may be identical to the first active circuit 201, the first ID block 205, the first output block 207, the first input block 209, and the first inout block 211, respectively. Additionally, the third semiconductor device 105 comprises a third active circuit 204, a third ID block 221, a third output block 223, a third input block 225, and a third inout block 227 which may be identical to the first active circuit 201, the first ID block 205, the first output block 207, the first input block 209, and the first inout block 211, respectively.

FIG. 2 additionally illustrates a number of the first external connections 113 which provide inputs and outputs that connect the support substrate 135 to the first I/O region 203 of the first semiconductor device 101. In a particular embodiment the first external connections 113 may comprise a CS_ENI ball 228, a Stack_ID ball 229, a data out ball 231, a data in ball 233, and a data inout ball 235. Additionally, while each of the CS_ENI ball 228, a Stack_ID ball 229, a data out ball 231, a data in ball 233, and the data inout ball 235 are illustrated and described as a single one of the first external connections 113, this is intended to be illustrative and is not intended to be limiting upon the embodiments. Rather, any of the inputs and outputs may comprise two or more of the first external connections 113, such as four, eight, sixteen, or the like. Any suitable number of the first external connections 113 may be utilized to provide inputs as each of the CS_ENI ball 228, the Stack_ID ball 229, the data out ball 231, the data in ball 233, and the data inout ball 235.

Returning now to the first I/O region 203 of the first semiconductor device 101, the first ID block 205 is utilized to store a first unique identifier for the first semiconductor device 101. The first unique identifier may be utilized to identify where within the first stack 100 the first semiconductor device 101 is located so that data signals can be directed specifically to the first semiconductor device 101 (as described further below). The first ID block 205 can be physically implemented in the first semiconductor device 101 by manufacturing the first ID block 205 within the first metallization layers 111 (see, e.g., FIG. 1).

Figure 3A:
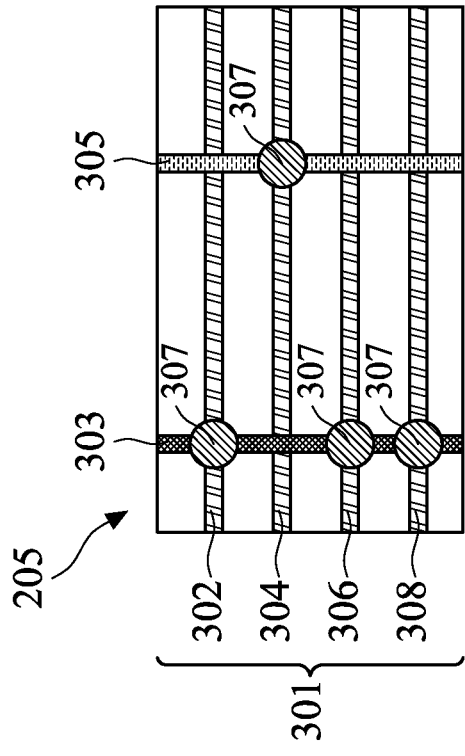
FIGS. 3A-3D illustrate views of a stored identifier block, in accordance with some embodiments.

FIG. 3A illustrates a top down, close up view of an embodiment in which the first ID block 205 is implemented within two layers of the first metallization layers 111 of the first semiconductor device 101. In looking at the close-up view of the first metallization layer 11, a first via block 402 of the first ID block 205 is formed of a nonvolatile, permanent memory structure by connecting one or more ID lines 301 (e.g., within a single layer of the first metallization layers 111) to reference voltage lines, such as one of either a low voltage source line 303 (e.g., a voltage source source (VSS) line) or a high voltage source line 305 (e.g., a voltage drain drain (VDD) line). In a particular embodiment the one or more ID lines 301 may comprise a first ID line 302, a second ID line 304, a third ID line 306, and a fourth ID line 308 which run parallel with each other, although any suitable number of ID lines in any suitable arrangement may be utilized.

In an embodiment the low voltage source line 303 and the high voltage source line 305 may be located in another layer, such as either an underlying or overlying layer of the first metallization layers 111 from the one or more ID lines 301. To connect one or more of the ID lines 301 to the low voltage source line 303 and/or the high voltage source line 305, one or more vias 307 may be formed to connect the one or more ID lines 301 to either the high voltage source line 305 or the low voltage source line 303.

By controlling the location and manufacture of the vias 307 between the one or more ID lines 301 and the high voltage source line 305 and the low voltage source line 303, the first semiconductor device 101 may be assigned the first unique identification number within the first stack 100 during the manufacture of the first semiconductor device 101. For example, in the embodiment illustrated in FIG. 3A, the first ID line 302 is connected by one of the vias 307 to the high voltage source line 305 while the second ID line 304, the third ID line 306, and the fourth ID line 308 are connected by vias 307 to the low voltage source line 303. As such, by reading the output from the one or more ID lines 301, the assigned unique identification number can be read from the first ID block 205.

Figure 3B:
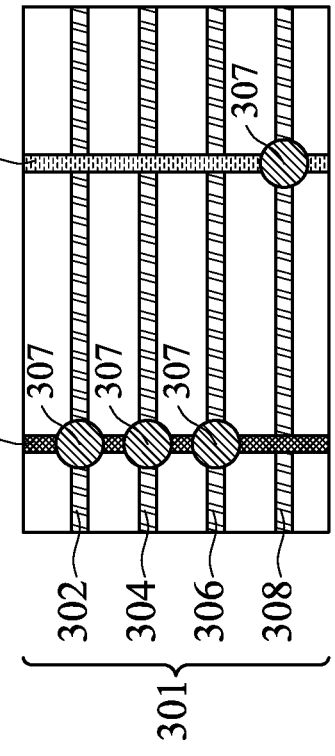

However, by utilizing the vias 307 to connect the one or more ID lines 301 to the low voltage source line 303 and the high voltage source line 305, a different unique identification number may be assigned to the first semiconductor device 101 during the manufacturing process by simply changing the location of the vias 307. For example, as can be seen in FIG. 3B, in another embodiment the first ID line 302, the third ID line 306, and the fourth ID line 308 are connected to the low voltage source line 303, while the second ID line 304 is connected by the via 307 to the high voltage source line 305. As such, by reading the output from the one or more ID lines 301, a separate unique identification number can be read from the first ID block 205.

Figure 3C:
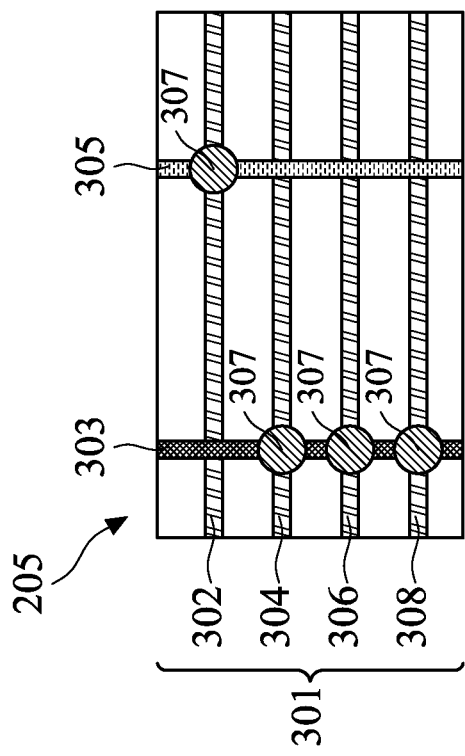

In yet another embodiment, as illustrated in FIG. 3C, a third unique identification number be obtained by yet another rearrangement of the vias 307 during the manufacturing process. For example, in this embodiment the first ID line 302, the second ID line 304, and the fourth ID line 308 are each connected to the low voltage source line 303 and the third ID line 306 is connected to the high voltage source line 305. As such, by reading the output from the one or more ID lines 301, a third unique identification number can be read from the first ID block 205.

Figure 3D:
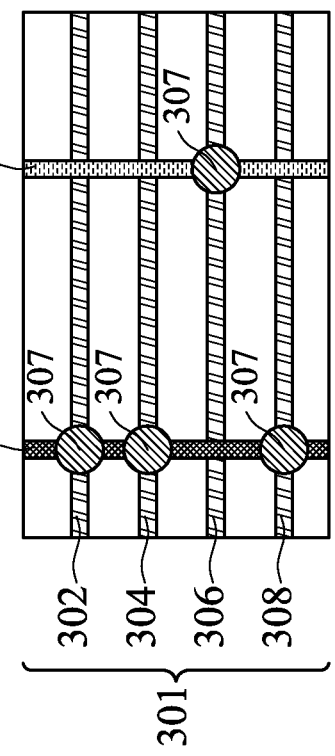

In yet another embodiment, as illustrated in FIG. 3D, a fourth unique identification number be obtained by yet another rearrangement of the vias 307 during the manufacturing process. For example, in this embodiment the first ID line 302, the second ID line 304, and the third ID line 306 are each connected to the low voltage source line 303 and the fourth ID line 308 is connected to the high voltage source line 305. As such, by reading the output from signals passing through the one or more ID lines 301, a fourth unique identification number can be read from the first ID block 205.

By modifying the location of one or more vias 307 located within a single layer of the first metallization layers 111, the first semiconductor device 101 may be provided a unique identification number during the manufacturing of the first semiconductor device 101. Additionally, if a different unique identifier is desired to be given to the first semiconductor device, only a single photolithographic mask (e.g., the photolithographic mask utilized to pattern the location of the vias 307) is changed without any other changes being made. As such, a simple and efficient process may be used to assign the first semiconductor device 101 any desired unique identification number.

Figure 4:
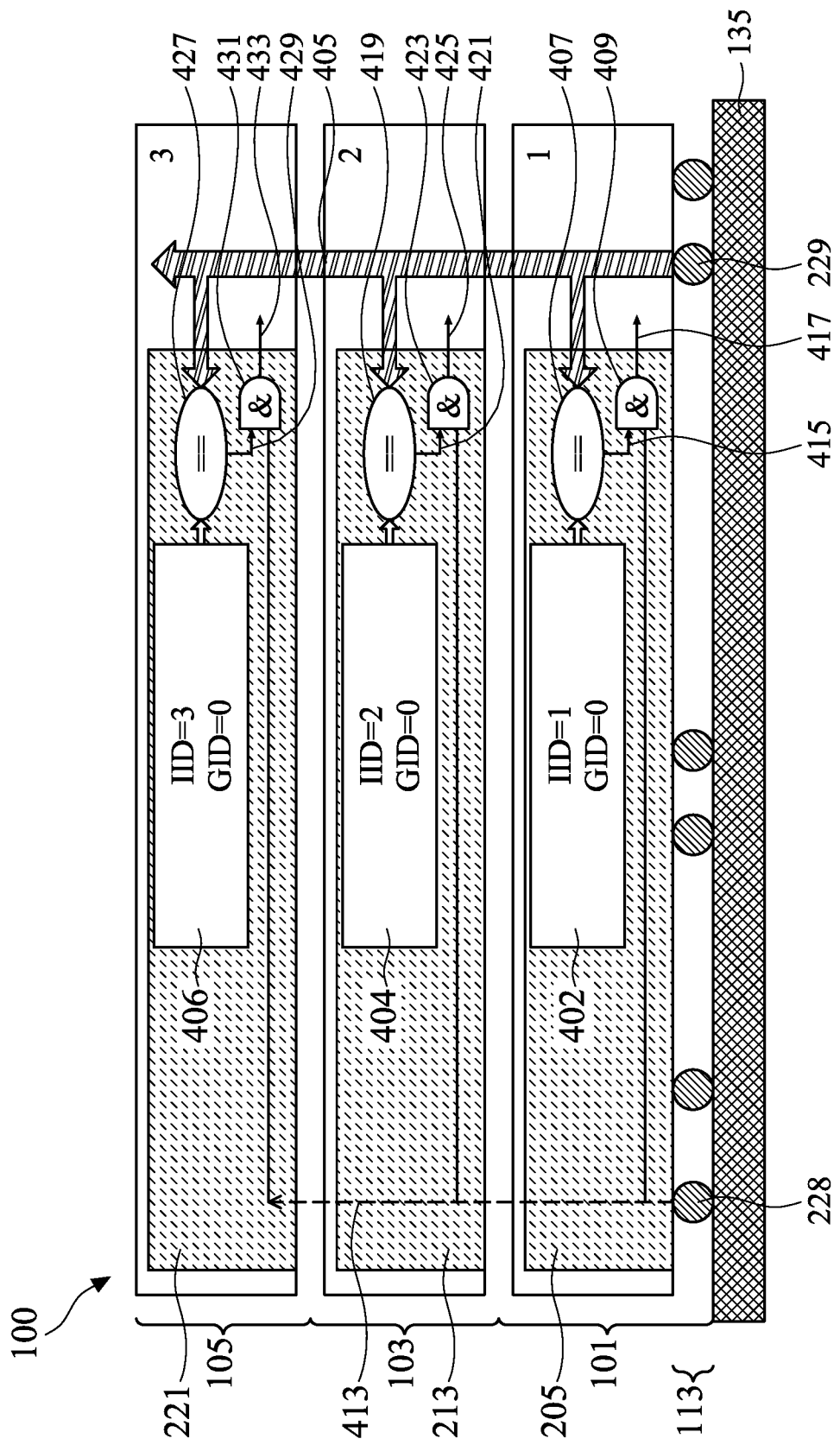
FIG. 4 illustrates a conceptual view of the stored identifier block, in accordance with some embodiments.

FIG. 4 illustrates the first stack 100 of the first semiconductor device 101, the second semiconductor device 103, and the third semiconductor device 105 on the support substrate 135, wherein the internal logic related to the first ID block 205, the second ID block 213, and the third ID block 221 is illustrated (instead of the precise structure) for clarity. In an embodiment the first ID block 205 of the first semiconductor device 101, the second ID block 213 of the second semiconductor device 103, and the third ID block 221 of the third semiconductor device 105 are each electrically connected to both the Stack_ID ball 229 and also to the CS_ENI ball 228.

In this embodiment, however, each semiconductor device in the first stack 100 is manufactured or otherwise given a unique identifier. For example, as illustrated in FIG. 4, the first semiconductor device 101 is assigned a first unique identifier of "1" using the first via block 402, the second semiconductor device 103 is assigned a second unique identifier of "2" using the second via block 404, and the third semiconductor device 105 is assigned a third unique identifier of "3" using the third via block 406. The unique identifiers are assigned within each semiconductor device as described above with respect to FIGS. 3A-3D, such as by modifying the location of the vias 307 within each one of the metallization layers.

When a data signal is desired to be sent to one of the semiconductor devices, a Stack_ID signal 405 is sent through the Stack_ID ball 229 and a CS_ENI signal 413 is sent through the CS_ENI ball 228 to each of the first semiconductor device 101, the second semiconductor device 103, and the third semiconductor device 105. In an embodiment the Stack_ID ball 229 may be a single one of the first external connections 113, although the precise number of the first external connectors 113 may also be a multiple or log of the number of semiconductor devices within the first stack 100. For example, in an embodiment in which sixteen semiconductor devices are in the first stack 100, there may be four of the first external connectors 112 used for the Stack_ID ball 229. However, any suitable number of first external connectors 112 or pins may be utilized.

Looking at the first semiconductor device 101, the Stack_ID signal 405 is received within the first ID block 205 by a first comparator 407. The first comparator 407 additionally has, as an input, the first unique identifier that is received as a signal from the first metallization layers 111 as described above with respect to FIGS. 3A-3D. Within the first comparator 407 the Stack_ID signal 405 is compared to the first unique identifier (e.g., "1" for the first semiconductor device 101). If the Stack_ID signal 405 received by the first semiconductor device 101 is the same as the unique identifier stored within the first semiconductor device 101, a first ID signal 415 is output from the first comparator 407 and sent to a first AND gate 409. Another input to the first AND gate 409 is connected to receive the CS_ENI signal 413 from the CS_ENI ball 228. The first AND gate 409 then determines if both the CS_ENI signal 413 and the first ID signal 415 are present and, if both are present, outputs a first select signal 417 from the first AND gate 409.

By using the first ID_block 205, the first semiconductor device 101 can determine if the first semiconductor device 101 has been selected to send and/or receive data signals from the support substrate 135, while other semiconductor devices within the first stack 100 are set in a bypass mode by default. For example, if the first select signal 417 is present, the first semiconductor device 101 has been selected to send and/or receive signals to and/or from the support substrate 135 (described further below). Additionally, if the first select signal 417 is not present, the first semiconductor device 101 has not been selected to send and/or receive signals to and/or from the support substrate 135, and remains in its default state wherein signals pass through and effectively bypass the first semiconductor device 101.

Additionally, while the use of both the Stack_ID signal 405 and the CS_ENI signal 413 is described above in an embodiment in which both signals are used to determine if the first semiconductor device 101 has been selected, this is intended to be illustrative and is not intended to be limiting on the embodiments. Rather, any suitable combination of signals may be utilized. For example, in another embodiment the first ID signal 415 itself may be utilized as the first select signal 417, and the CS_ENI ball 228 and the first AND gate 409 are optional and may be removed. Any such combination of elements may be utilized.

Looking next at the second semiconductor device 103, in some embodiments the second semiconductor device 103 is set up identically to the first semiconductor device 101, but with the second ID block 213 storing the second unique identifier (e.g., "2") instead of the first unique identifier (e.g., "1"). For example, the second semiconductor device 103 may receive the Stack_ID signal 405 with a second comparator 419, and if the Stack_ID signal 405 is equal to the second unique identifier stored within the second ID_Block 213, a second ID signal 421 is sent to a second AND gate 423 with the CS_ENI signal 413 connected as an input. If the second semiconductor device 103 is chosen, the second AND gate 423 outputs a second select signal 425. If the second semiconductor device 103 is not chosen, the second semiconductor device 103 remains in the default state, wherein signals are passed through the second semiconductor device 103.

Looking next at the third semiconductor device 105, in some embodiments the third semiconductor device 105 is set up identically to the first semiconductor device 101, but with the third unique identifier (e.g., "3") stored within the third ID block 221 instead of the first unique identifier (e.g., "1"). For example, the third semiconductor device 105 may receive the Stack_ID signal 405 with a third comparator 427, and if the Stack_ID signal 405 is equal to the third unique identifier stored within the third ID_Block 221, a third ID signal 429 is sent to a third AND gate 431 with the CS_ENI signal 413 connected as an input. If the third semiconductor device 105 is chosen, the third AND gate 431 outputs a third select signal 433. If the third semiconductor device 105 is not chosen, the third semiconductor device 105 remains in the default state, wherein signals are passed through the third semiconductor device 105.

Optionally, in some embodiments the first ID block 205 of the first semiconductor device 101, the second ID block 213 of the second semiconductor device 103, and the third ID block 221 of the third semiconductor device 105 may also comprise a plurality of unique identifiers. For example, in addition to having individual unique identifiers (e.g., the first unique identifier, the second unique identifier, and the third unique identifier), the first semiconductor device 101, the second semiconductor device 103, and the third semiconductor device 105 may also comprise a group unique identifier (e.g., "0") which may be used to place the semiconductor devices into a group of more than one of the semiconductor devices (e.g., into a group including each of the first semiconductor device 101, the second semiconductor device 103, and the third semiconductor device 105). In such an embodiment the first comparator 407 of the first semiconductor device 101 also compares each group unique identifier to the incoming Stack_ID signal 405 and also outputs the first ID signal 415 when the group unique identifier is received. By using the group unique identifier, signals can be sent to all of the semiconductor devices within the group at the same time instead of having to send separate ID signals for each of the semiconductor devices.

Figure 5A:
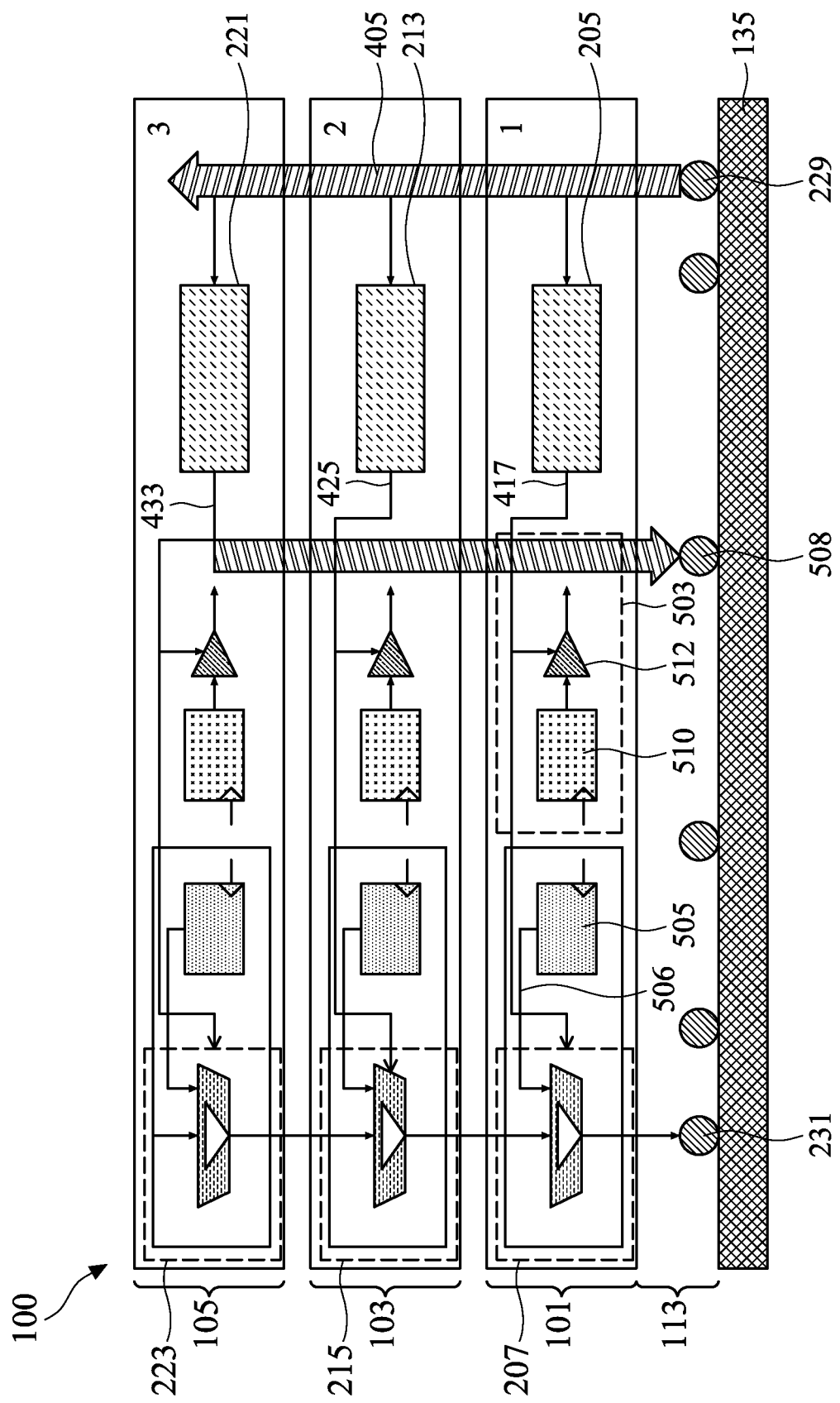
FIGS. 5A-5B illustrate a conceptual view of an output block, in accordance with some embodiments.
Figure 5B:
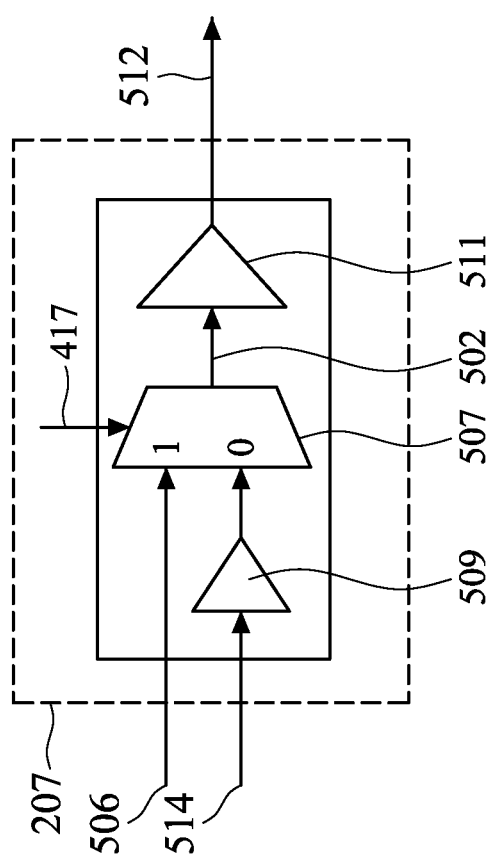

FIGS. 5A-5B illustrate a conceptual version of the first output block 207 within the first semiconductor device 101 that may be used to output a data signal from the first semiconductor device 101 to the support substrate 135 when the first semiconductor device 101 has been chosen. In an embodiment the first output block 207 receives the first select signal 417 (e.g., from the first ID block 205) and, if the first semiconductor device 101 is chosen, the first output block 207 sends data from the first semiconductor device 101 to the data out ball 231. However, if the first semiconductor device 101 is not selected (e.g., the first output block 207 does not receive the first select signal 417), the first output block 207 will send a signal it receives from an overlying semiconductor device (e.g., the second semiconductor device 103) to the data out ball 231.

Looking at a particular embodiment, the first output block 207 is connected to a first data source 505. In some embodiments the first data source 505 may be a data flip flop (DFF), although any suitable data source may be utilized. In an embodiment the first data source 505 is connected to a remainder of the first active circuits 201 within the first semiconductor device 101, and an output of the first data source 505 (e.g., a first data source line 506) is connected to the first output block 207.

FIG. 5B illustrates a close-up view of one particular embodiment of the first output block 207. In this embodiment the first data source line 506 is connected as one input into a first multiplexer 507. Additionally, the first multiplexer 507 is connected to the first select signal 417 as the selector for the first multiplexer 507. As such, when the first ID_block 205 registers that the Stack_ID signal 405 is selecting the first semiconductor device 101, the first select signal 417 is input into the first multiplexer 507 and signals sent along the first data source line 506 are selected as a first multiplexer output signal 502 output from the first multiplexer 507. Once the first multiplexer output signal 502 leaves the first multiplexer 507, the first multiplexer output signal 502 is applied to a first output pad 511 (with, e.g., an output amplifier and electrostatic discharge protection) and eventually sent out of the first semiconductor device 101 as a first data out signal 512 into the support substrate 135.

However, in embodiments in which the first ID block 205 registers that the Stack_ID signal 405 is not selecting the first semiconductor device 101, the first select signal 417 is not input into the first multiplexer 507. Further, another one of the inputs to the first multiplexer 507 may be connected to receive a signal from an overlying one of the semiconductor devices (e.g., a second data out signal 514 from an output of the second output block 215 in the second semiconductor device 103). In a particular embodiment the second data out signal 514 may be sent by the second output block 215 of the second semiconductor device 103 and input into a second input pad 509 (with, e.g., a second amplifier along with electrostatic discharge protection) before being connected as an input into the first multiplexer 507.

As such, when the first semiconductor device 101 is not selected, the second data out signal 514 (from the overlying second semiconductor device 103 or the third semiconductor device 105) is chosen as the data out signal 512 to exit the first semiconductor device 101. In this setup, the first semiconductor device 101 is effectively by-passed and data from the selected, overlying semiconductor devices is sent out of the first stack 100 to the support substrate 135.

Looking next at the second semiconductor device 103 and the third semiconductor device 105, the second semiconductor device 103 has the second output block 215 and the third semiconductor device 105 has the third output block 223. In some embodiments the second output block 215 and the third output block 223 may be identical to the first output block 205 as described in FIG. 5B. As such, in each of the second output block 215 and the third output block 223, either the second select signal 425 (of the second semiconductor device 103) or the third select signal 433 (of the third semiconductor device 105) is utilized to choose the output of a multiplexer to either output the data from the selected semiconductor device or to output the data from an overlying semiconductor device. These data signals can be sent through external connections which are aligned with each other or, in an embodiment in which the external connections are not aligned with each other, the signals are routed through a metallization layer or redistribution layer.

By utilizing the first output block 207, the second output block 215, and the third output block 223, identical structures may be manufactured within each of the first semiconductor device 101, the second semiconductor device 103, and the third semiconductor device 105, and the Stack_ID signal 405 can be used to select which semiconductor device sends data out of the first stack 100. For example, if the Stack_ID signal 405 selects the third semiconductor device 105, the third output block 223 will send data through both the second semiconductor device 103 and the first semiconductor device 101 to the data out ball 231. Additionally, while the third semiconductor device 105 is selected, the first semiconductor device 101 and the second semiconductor device 103 are not transmitting data signals, and allows the overlying signals to pass through them.

Additionally, because the top semiconductor device within the first stack 100 (e.g., the third semiconductor device 105) has the same structure as the other semiconductor devices, the third semiconductor device 105 also has an external connector not connected to anything. As such, with respect to the top semiconductor device within the first stack 100 (e.g., the third semiconductor device 105 within the first stack 100 illustrated), the second input for the multiplexer may be tied to a low voltage source or a high voltage. By tying this input to a low voltage source or a high voltage source, a floating state, such as a tri-state, may be avoided.

By manufacturing and operating the output blocks as described above, a lego-based structure (both physically and logically) is obtained and there is no need for a global multiplexer and no floating net issues, as only the selected semiconductor device can drive while other semiconductor devices are set into bypass mode. Additionally, there is a predictable I/O loading and latency design because there is localized loading to avoid load variation from the number of semiconductor devices, as the first output pad 511 drives the signal from the current semiconductor device while the second input pad 509 drives the signal received from an overlying semiconductor device.

As such, latency differences can be mitigated by using a burst mode. In particular, in such a mode data a device transmits data repeatedly without going through all of the steps (e.g., the initial delay caused by waiting for inputs from another device, waiting for internal processes to terminate, delays caused by initial communications, etc.) required to transmit each piece of data in a separate transaction. As such, data is continuously sent for a fixed number of cycles (e.g., N number of cycles) and then data is not sent continuously for another fixed number of cycles (e.g., K cycles). As such, the average unit of data per cycle equals N/(N+K) which equals 1/(1+K/N), such that, when N is much greater than K, the impact from K can be ignored.

FIG. 5A additionally illustrates an optional embodiment in which the first output block 207 is not the only output region within the first semiconductor device 101. In this embodiment, there is a second output region 503 which can be utilized in addition to the first output block 207 in order to send data and signals out of the first semiconductor device 101 and into the support substrate 135 through, e.g., one of the first external connections 113 such as a slow data out ball 508. In an embodiment the second output region 503 may be a general purpose I/O (GPIO) output, and in some particular embodiments the second output region 503 may have a different data transfer speed from the first output block 207. For example, the first output block 207 may have a smaller loading (e.g., because there is a shorter path to the input of the underlying structure and, therefore, lower resistance/capacitance issues), while the second output region 503 has a larger loading (e.g., because there is a longer path to the output and, therefore, larger resistance/capacitance issues).

In an embodiment in which the second output region 503 has a data transfer speed that is less than the data transfer speed of the first output block 207, the second output region 503 and the first output block 207 may be utilized in conjunction with each other to transfer data out of the first semiconductor device 101. For example, for speed sensitive data which needs to be transferred fast, the data may be sent through the first output block 207, while data which is less time sensitive may then be sent through the second output region 503 at a lower speed. However, any suitable combination of usages between the first output block 207 and the second output region 503 may be utilized in order to transfer data out of the first semiconductor device 101.

In another embodiment the second output region 503 will only send data when gated by the select signal 417. For example, as the Stack_ID signal 405 is received and the first select signal 417, second select signal 425, and third select signal 433 are generated, the second output region 503 can receive the first select signal 417 and, if the first semiconductor device 101 is selected, the second output region 503 can then output data through the slow data out ball 508.

In some embodiments the second output region 503 may comprise a second data source 510 (e.g., a second data flip flop (DFF)) which has an output to data out amplifier 512. Additionally, the data out amplifier 512 has a selector connected to the first select signal 417. Given this, when the first semiconductor device 101 has been selected, the data stored in the second data source 510 is output through the slow data out ball 508 (while other data is output through the first output block 207). As such, data from the first semiconductor device 101 may be sent through the best output from the first semiconductor device 101.

Figure 6A:
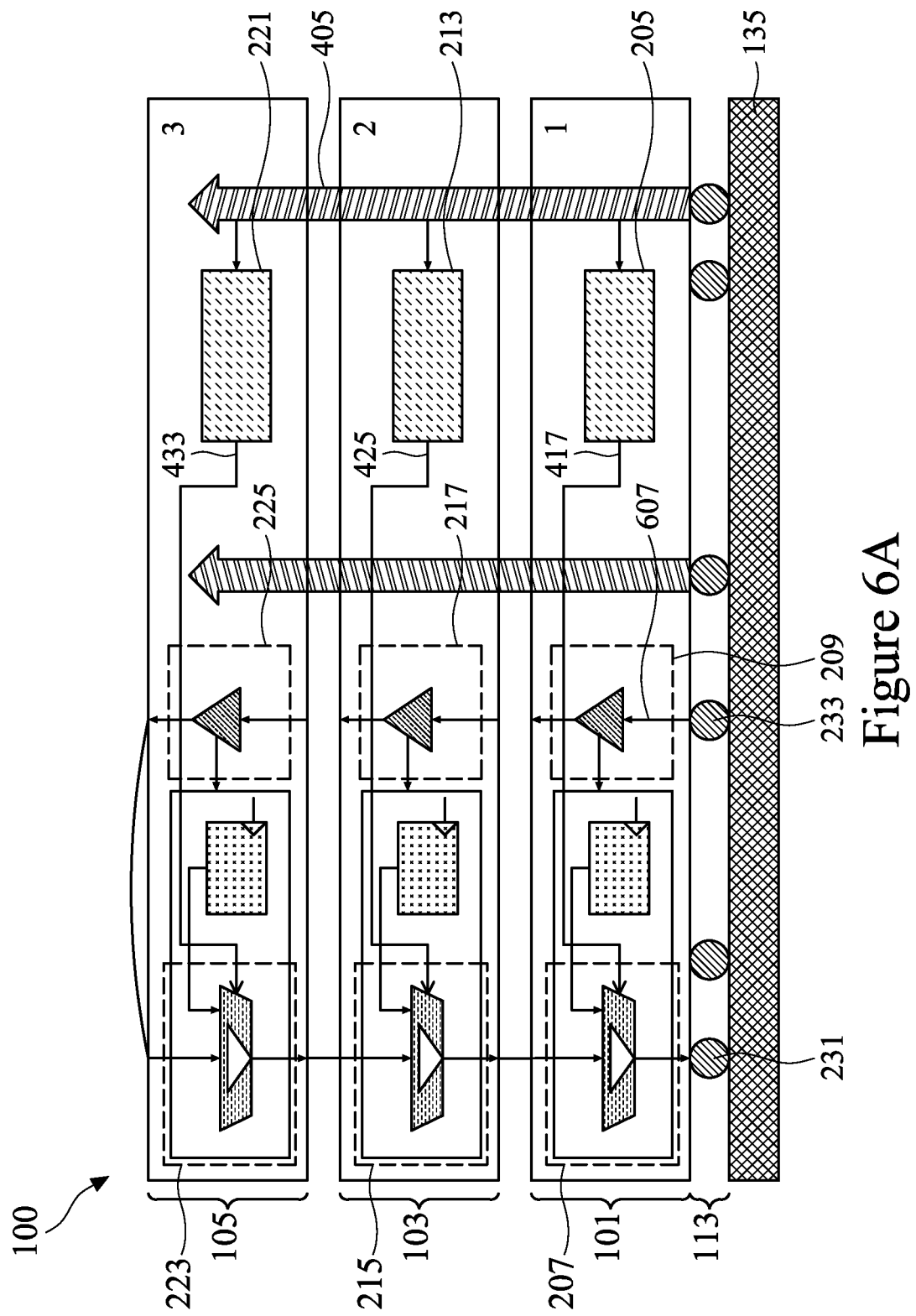
FIGS. 6A-6B illustrate a conceptual view of an input block, in accordance with some embodiments.

FIG. 6A illustrates a conceptual view of the first input block 209 of the first semiconductor device 101, the second input block 217 of the second semiconductor device 103, and the third input block 225 of the third semiconductor device 105 (with the first output block 207, the second output block 215, and the third output block 223 also being illustrated). The first input block 209, the second input block 217, and the third input block 225 collectively are connected to the data in ball 233 to receive a data in signal 607 from the support substrate 135. However, because the data in signal 607 is not specific to a particular semiconductor device, neither of the first select signal 417, the second select signal 425, or the third select signal 433 are connected to the first input block 209, the second input block 217, or the third input block 225.

Figure 6B:
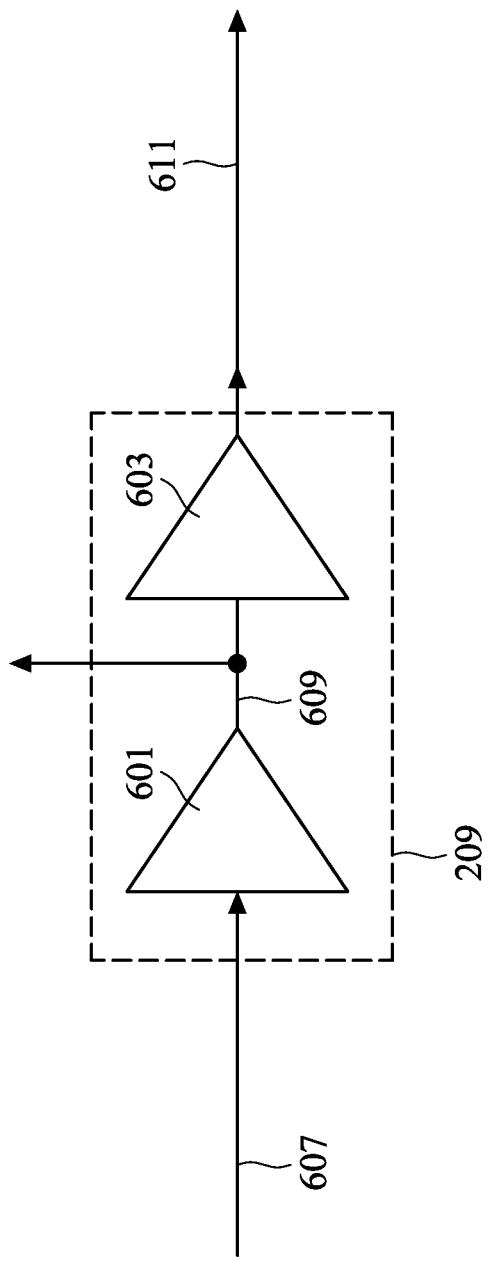

FIG. 6B illustrates a close-up view of a schematic diagram of the first input block 209 of the first semiconductor device 101. In an embodiment the first input block 209 comprises a third input pad 601 (with, e.g., a buffer and electrostatic discharge protection) and a fourth output pad 603 (with, e.g., a buffer and electrostatic discharge protection) arranged in series with each other. Looking first at the third input pad 601, an input to the third input pad 601 of the first semiconductor device 101 is connected to the data in ball 233. As such, when the data in signal 607 is applied to the data in ball 233 from the support substrate 135, the data in signal 607 is directed into the third input pad 601, where the third input pad 601 is utilized to drive the data in signal 607 to the first semiconductor device 101.

A first output from the third input pad 601 is connected to the first active circuits 201 of the first semiconductor device 101 in order to pass a buffered data in signal 609 into the first semiconductor device 101. In some embodiments the buffered data in signal 609 may be connected to the first data source 505 (e.g., the data flip flop (DFF)) which can then be utilized to forward the amplified data in signal 609 into a remainder of the circuitry of the first semiconductor device 101. However, in other embodiments the buffered data in signal 609 may be connected to other data sources, buffers, other memories, combinations of these, or the like, and any suitable transfer of the buffered data in signal 609 into the first semiconductor device 101 may be utilized.

The buffered data in signal 609 that is output from the third input pad 601 is additionally directed towards the fourth output pad 603 in order to send the buffered data in signal 609 towards the overlying second semiconductive device 103. In particular, the buffered data in signal 609 (from the third input pad 601) is applied to an input of the fourth output pad 603 and the fourth output pad 603 outputs a second buffered data in signal 611. The second buffered data in signal 611 is then directed to the second input block 217 of the second semiconductor device 103.

Returning to FIG. 6A, and looking next at the second semiconductor device 103, in some embodiments the second input block 217 of the second semiconductor device 103 is set up identically to the first input block 209 of the first semiconductor device 101. For example, the second semiconductor device 103 may receive the second buffered data in signal 611 from the first semiconductor device 101 with the second input block 217 (comprising, e.g, two pads with amplifiers arranged in series with each other). Further, the second input block 217 outputs another buffered data in signal to second active circuits 202 of the second semiconductor device 103 and another buffered data in signal which is sent to an overlying semiconductor device (e.g., the third semiconductor device 105). These data signals can be sent through external connections which are aligned with each other or, in embodiments in which the external connectors are not aligned with each other, the signals are routed through a metallization layer or redistribution layer.

Looking next at the third semiconductor device 105, in some embodiments the third input block 225 of the third semiconductor device 105 is set up identically to the first input block 209 of the first semiconductor device 101. For example, the third semiconductor device 105 may receive the buffered data in signal from the second semiconductor device 103 with the third input block 225 (comprising, e.g, two pads with buffers arranged in series with each other). Further, the third input block 225 outputs another buffered data in signal to the third active circuit 204 of the third semiconductor device 105 as well as outputting another buffered data in signal. These data signals can be received through external connections which are aligned with each other or, in embodiments in which the external connectors are not aligned with each other, the signals are routed through a metallization layer or redistribution layer.

In some embodiments, the buffered data in signal that exits the third input block 225 of the third semiconductor device 105 may be optionally looped back to be an input to the third output block 223 in order to form one boundary scan chain (e.g., SCAN) that can be used to check stacking die connectivity as well as help to measure delay through the semiconductor devices. For example, by connecting the output of the third input block 225 to the input of the third output block 223, through, e.g., a metallization layer or a redistribution layer, when all of the semiconductor devices (e.g., each of the first semiconductor device 101, the second semiconductor device 103, and the third semiconductor device 105) are unselected, the data in signal 607 will pass through and be buffered and/or amplified by each of the first input block 209, the second input block 217, the third input block 225, the third output block 223, the second output block 215, and the first output block 207 before being routed back to the support substrate 135. As such, the amount of time that it takes for the data in signal 607 to pass into and out of the first stack 100 can be measured. Such measurements can then be either compared to standards to determine if there are any defects within the first stack 100 or else be utilized to determine delay settings (as discussed further below) for the first control block 801.

By manufacturing and operating the input blocks as described above, a lego-based structure (both physically and logically) is obtained and there is no need for a global multiplexer. Additionally, there is a predictable I/O loading and latency design, wherein each device within the first stack 100 drives localized loads to the next device in the first stack 100 and latency differences can be mitigated by using a burst mode. This allows for a structure like a DRAM super buffer solution which provides for a shorter latency.

Figure 7A:
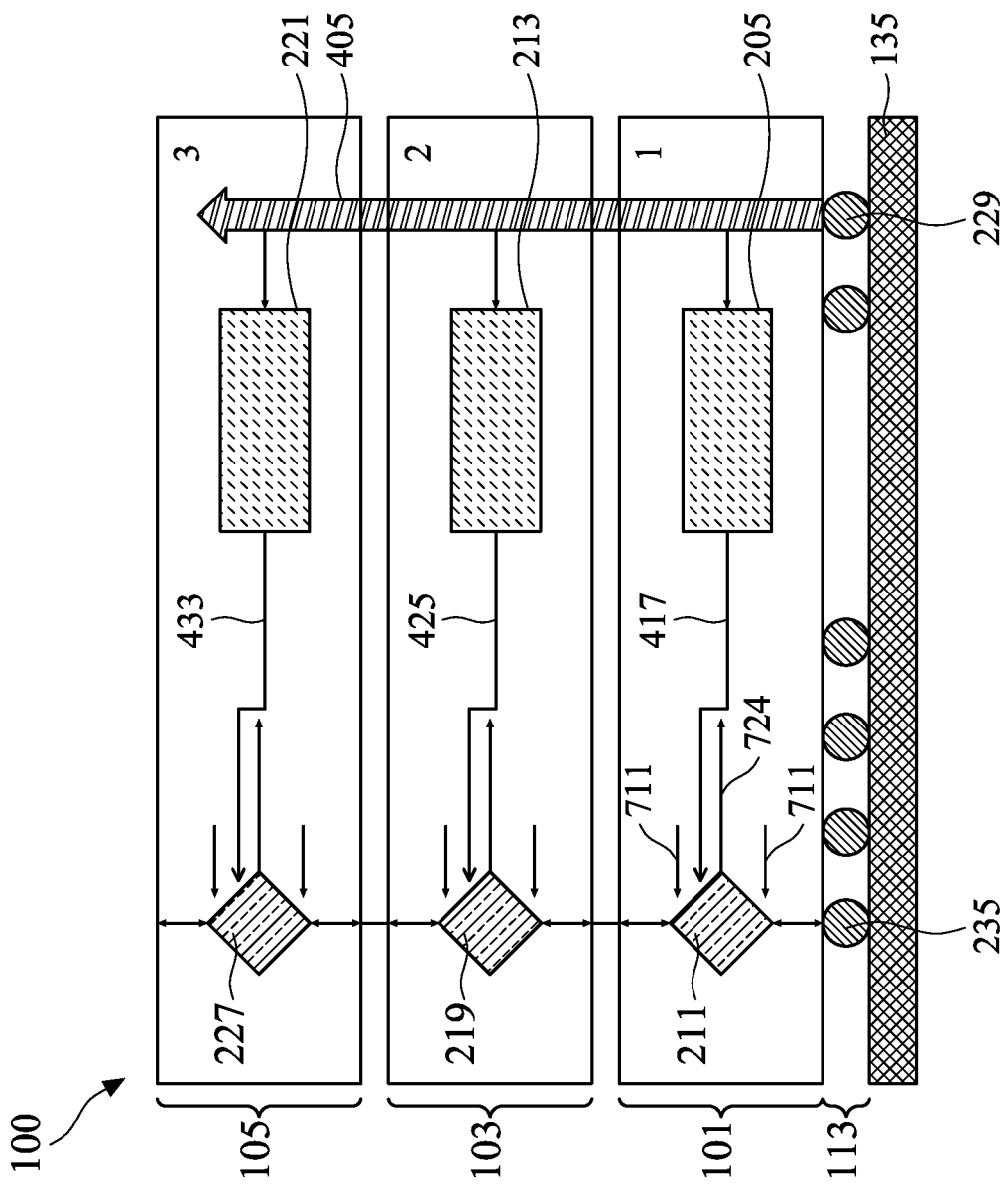
FIGS. 7A-7B illustrate a conceptual view of an inout block, in accordance with some embodiments.

FIG. 7A illustrates a conceptual view of the first inout block 211 of the first semiconductor device 101, the second inout block 219 of the second semiconductor device 103, and the third inout block 227 of the third semiconductor device 105. Each of the first inout block 211, the second inout block 219, and the third inout block 227 may be utilized to send and/or receive signals from the data inout ball 235 of the first external connections 113 when the respective semiconductor device is selected by the Stack_ID signal 405 (as read by the first ID block 205, the second ID block 213, and the third ID block 221). Additionally, the first inout block 211 may be used in addition to or in place of the first output block 207 and the first input block 209, the second inout block 219 may be used in addition to or in place of the second output block 215 and the second input block 217, and the third inout block 227 may be used in addition to or in place of the third output block 223 and the third input block 225. Any suitable combination and/or usage of the inout blocks, the input blocks, and the output blocks, either structurally or functionally, may be utilized.

Figure 7B:
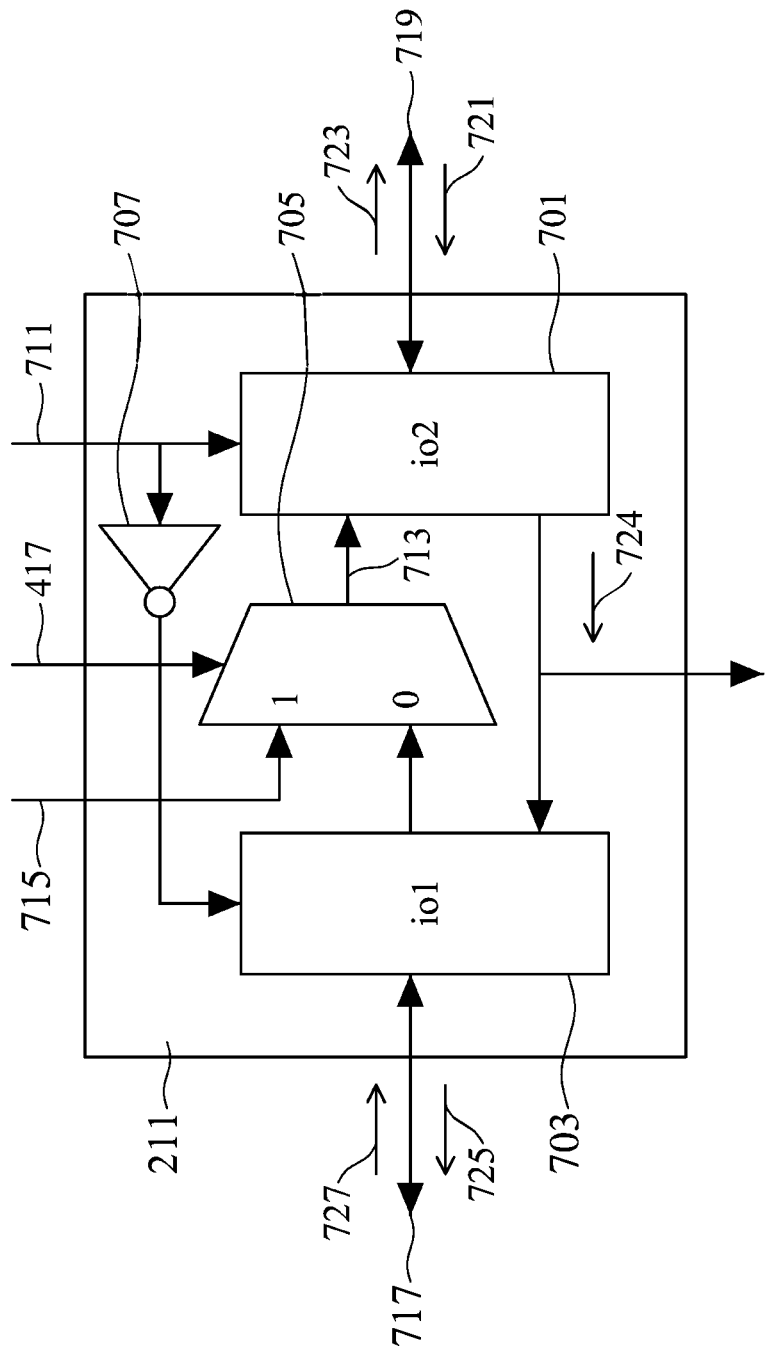

FIG. 7B illustrates a close-up view of a schematic diagram of the first inout block 211. In an embodiment the first inout block 211 comprises a first I/O cell 701, a second I/O cell 703, a second multiplexer 705, and a first inverter 707. Looking first at the first I/O cell 701, the first I/O cell 701 is connected to the data inout ball 235 (see FIG. 7A) to allow for bi-directional passage of signals between the first semiconductor device 101 and the support substrate 135. For example, in some embodiments the first I/O cell 701 may be utilized to send a first inout out signal 723 from the first semiconductor device 101 to the support substrate 135, while in other embodiments the first I/O cell 701 may be utilized to receive a first inout in signal 721 from the support substrate 135.

In order to switch between the first I/O cell 701 sending and receiving data signals, the first I/O cell 701 also comprises an input to receive an output enable ("OE") signal 711 that selects whether or not the first I/O cell 701 sends a signal to the support substrate 135 or receives a signal from the support substrate 135. The OE signal 711 originates within the first semiconductor device 101 when the first semiconductor device 101 determines that a change in operation is desired. For example, in some embodiments the OE signal 711 may be applied when the first semiconductor device 101 decides to output data (e.g., output the first inout out signal 723), while in other embodiments the OE signal 711 is not applied when the first semiconductor device 101 decides to receive input signals (e.g., receive the first inout in signal 721). However, any suitable application of one or more signals may be utilized to switch between receiving and sending.

The OE signal 711, in addition to being applied to the first I/O cell 701, is also applied to the second I/O cell 703 in order to set the second I/O cell 703 to either receive or send data. However, because the first I/O cell 701 and the second I/O cell 703 perform opposite functions at any single time, the OE signal 711 is applied to the second I/O cell 703 through, for example, a first inverter 707. As such, the second I/O cell 703 is set to an opposite operating state than the first I/O cell 701.

To allow for operation of the first inout block 211 to send data to the support substrate 135, the second multiplexer 705 is located between the first I/O cell 701 and the second I/O cell 703. In an embodiment a second multiplexer output signal 713 is connected as an input to the first I/O cell 701.

Additionally, one input of the second multiplexer 705 is connected to a data inout in signal 715 to receive data from the first active circuit 201 of the first semiconductor device 101 while a second input of the second multiplexer 705 is connected to the second I/O cell 703. Finally, the first select signal 417 is connected to the second multiplexer 705 in order to select which input to the second multiplexer 705 is output as the second multiplexer output signal 713 (and, hence, output through the first I/O cell 701).

Additionally, to allow for operation of the first inout block 211 to receive the first inout in signal 721 from the support substrate 135 and either send the data inout signal to the first active circuit 201 or else to send it to an overlying semiconductor device (e.g., the second semiconductor device 103), an output of the first I/O cell 701 is connected as an input of the second I/O cell 703. The output of the first I/O cell 701 is additionally routed to the first active circuits 201 of the first semiconductor device 101 as input data.

Finally, to allow for connection to overlying semiconductor devices (e.g., the second semiconductor device 103), the second I/O cell 703 has a second input/output connection 717. In an embodiment the second input/output connection 717 is connected to, for example, the second inout block 219 (see, e.g., FIG. 7A) located within the second semiconductor device 103. As such, a second inout out signal 725 can be sent as an output from the second inout block 219 to be received by the second semiconductor device 103 through the second input/output connection 717. Additionally, the second I/O cell 703 can receive a second inout in signal 727 over the second input/output connection 717 from the overlying semiconductor devices (e.g., the second semiconductor device 103).

In operation, when data is desired to be output to the support substrate 135, the OE signal 711 is set to, for example, "1". As such, the first I/O cell 701 is set to output the second multiplexer output signal 713 from the second multiplexer 705 to the support substrate 135 through the first input/output connection 719. Additionally, to determine which data is to be output, the first select signal 417 is set to either "1," in which case the data from the first semiconductor device 101 (e.g., data inout in signal 715) is output through the second multiplexer 705, or is set to "0", in which case data from an overlying semiconductor device (e.g., the second inout in signal 727 from either the second semiconductor device 103 or the third semiconductor device 105) is sent through the second multiplexer 705, effectively bypassing the first semiconductor device 101.

In an operation in which data is desired to be input from the support substrate 135, the OE signal 711 is set to, for example, "0". As such, the first I/O cell 701 is set to receive the first inout in signal 721 from the first input/output connection 719. The first I/O cell 701 may comprise an amplifier (not separately illustrated in FIG. 7B) in order to drive the input data both into the first active circuit 201 of the first semiconductor device 101 as a first amplified inout in signal 724 and also to drive the first amplified inout in signal 724 to the second I/O cell 703. The second I/O cell 703 may then also comprise another amplifier (also not separately illustrated in FIG. 7B) which may be used to drive a second inout out signal 725 through the second input/output connection 717 and to the overlying semiconductor devices such as the second semiconductor device 103.

However, while specific structures and specific settings have been described with respect to FIGS. 7A and 7B, these descriptions are intended to be illustrative and are not intended to be limiting to the embodiments. Rather, any suitable structures and any suitable settings may be utilized in order to implement the first inout block 211. All such structures and settings are fully intended to be included within the scope of the embodiments.

Looking next at the second semiconductor device 103, in some embodiments the second inout block 219 of the second semiconductor device 103 is set up identically to the first semiconductor device 101. For example, when the second inout block 219 is set to receive data from the support substrate 135, the second semiconductor device 103 may receive the second inout out signal 725 from the first semiconductor device 101 with the second inout block 219. Further, the second inout block 219 outputs another amplified inout data in signal to the internal circuitry of the second semiconductor device 103 and another amplified data in signal which is sent to an overlying semiconductor device (e.g., the third semiconductor device 105). Additionally, when data is desired to be sent from the second semiconductor device 103, the second inout block 219 will send the second inout in signal 727 to the first inout block 211 in the first semiconductor device 101. These data signals can be sent through external connections which are aligned with each other or not aligned with each other (e.g., the signals are routed through a metallization layer or redistribution layer).

Looking next at the third semiconductor device 105, in some embodiments the third inout block 227 of the third semiconductor device 105 is set up identically to the first semiconductor device 101. For example, when the third inout block 227 is set to receive data from the support substrate 135, the third semiconductor device 105 may receive the data from the second semiconductor device 103 with the third inout block 227. Additionally, when data is desired to be sent from the third semiconductor device 105, the third inout block 227 will send an inout in signal to the second inout block 219 in the second semiconductor device 103. These data signals can be sent through external connections which are aligned with each other or not aligned with each other (e.g., the signals are routed through a metallization layer or redistribution layer).

Further, in embodiments in which the third inout block 227 is the top semiconductor device of the first stack 100, the input to the second I/O cell 703 within the third semiconductor device 105 may be tied to a reference voltage. In some embodiments the reference voltage may be either a low voltage source or a high voltage source. By tying this input to the reference voltage, a floating state, such as a tri-state, may be avoided.

By manufacturing and operating the inout blocks as described above, a lego-based structure (both physically and logically) with bidirectional I/O pins (e.g., for FPGAs) is obtained and each of the semiconductor devices within the stack 100 has a similar load so that the overall load does not change as the number of semiconductor devices in the first stack 100 gets larger. This also forms a flexible design and allows a user to configure the first external connections 113 associated with the inout blocks to be either input or output connections, which offer greater flexibility.

Figure 8A:
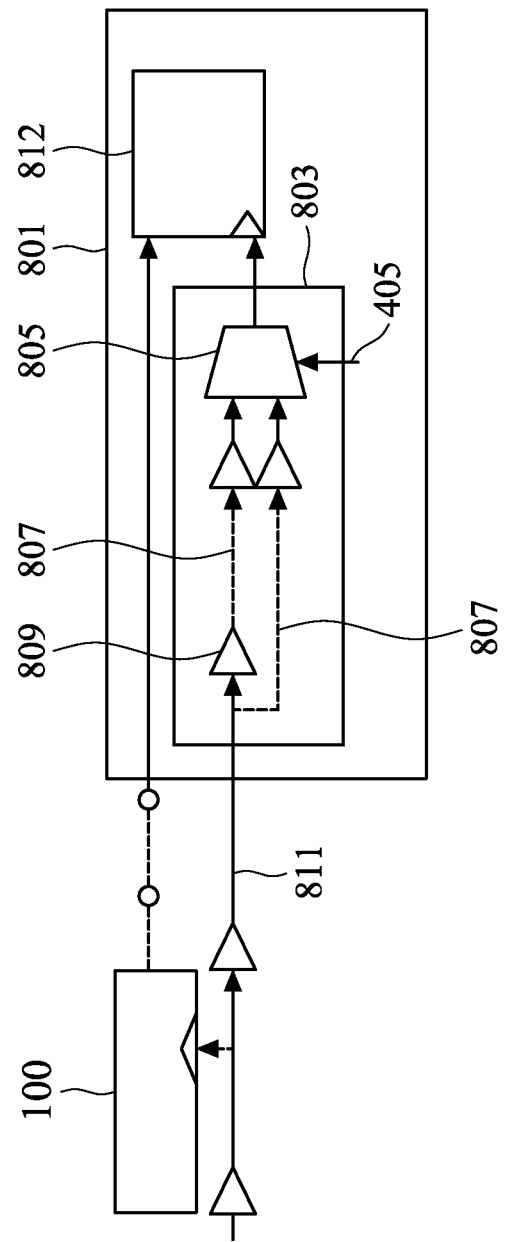
FIGS. 8A-8B illustrate a control block, in accordance with some embodiments.

FIG. 8A illustrates the first control block 801 that can be connected to the first stack 100 through, e.g., the support substrate 135. In an embodiment the first control block 801 may be a Stack_ID based, fast sharing I/O controller and may be utilized in order to receive and capture data that is output from the semiconductor devices located within the first stack 100 (e.g., the first semiconductor device 101, the second semiconductor device 103, and the third semiconductor device 105).

In an embodiment the first control block 801 may comprise one or more individual timing adjustment cells 803 (with one such timing adjustment cell 803 being illustrated in FIG. 8A for clarity). Each of the individual timing adjustment cells 803 comprises two or more delay lines 807 which are utilized to receive an incoming clock signal 811 and separate the clock signal 811 into a plurality of clock signals (one per each line), wherein each of the separated plurality of clock signals are delayed by different amounts based on the structure of the delay lines 807.

In a particular embodiment each of the two or more delay lines 807 comprise a different number of delay elements 809 so that each of the two or more delay lines 807 delay the clock signal 811 by different amounts. In an embodiment the delay elements 809 may be buffers, inverters, combinations of these, or the like, through which the clock signal 811 may be delayed as the clock signal 811 works through the delay element 809. However, any suitable type of structure may be utilized for the delay element 809.

To obtain different amounts of delay, each of the two or more delay lines 807 comprise a different number of the delay elements 809. In the precise embodiment illustrated in FIG. 8A, a first one of the two or more delay lines 807 comprises two delay elements 809 and a second one of the two or more delay lines 807 comprises a single delay element 809. However, any suitable number of delay elements 809, including no delay elements 809, may be utilized to provide a desired delay to the incoming clock signal 811.

Once each of the two or more delay lines 807 delay the incoming clock signal 811 into separate delayed clock signals, the separate delayed clock signals are then input into a third multiplexer 805. By inputting the separate delayed clock signals into the third multiplexer 805, a single one of the delayed clock signals can be chosen as an output of the third multiplexer 805, thereby allowing the incoming clock signal 811 to be delayed by any chosen amount of delay.

Additionally, to determine which of the two or more delay lines 807 should be output from the third multiplexer 805, the two or more delay lines 807 are each individually associated with the individual semiconductor devices of the first stack 100 (e.g., the first delay lines is associated with the first semiconductor device 101, the second delay lines is associated with the second semiconductor device 103, etc.). This association can be done using either simulation data, through practical testing of the semiconductor devices within the first stack 100, combinations of these, or the like. However, any suitable method of determining latency and associating the individual semiconductor devices with the individual delay lines may be utilized.

In a particular embodiment in which practical testing is desired, the lookback test measurement described above with respect to FIGS. 6A-6B may be used to determine the latency of data signals as the data signals travel through the first stack 100. For example, a signal can be applied to the first semiconductor device 101, the second semiconductor device 103, and the third semiconductor device 105 and then received back from the first stack 100, whereby the delay is measured for data sent to each of the first semiconductor device 101, the second semiconductor device 103, and the third semiconductor device 105. However, any suitable method for obtaining practical test data may be utilized.

Once the delay data for each of the first semiconductor device 101, the second semiconductor device 103, and the third semiconductor device 105 has been obtained, the data may be stored within the first control block 801. In a particular embodiment the data may be stored by generating a table which associates the unique identifiers of each semiconductor device with the related output cell latency and associated delay line. However, any suitable method of storing the association may be utilized.

In operation, when data is desired to be read from one of the semiconductor devices in the first stack 100, the desired semiconductor's unique identifier is utilized to select which of the two or more delay lines 807 is output through the third multiplexer 805. In particular, the Stack_ID signal 405 may be used to choose which delay signal is output from the third multiplexer 805 based on which of the first semiconductor device 101, the second semiconductor device 103, and the third semiconductor device 105 is sending the output signal.

Once the clock signal 811 has been delayed and then output of the third multiplexer 805 based on the desired semiconductor device within the first stack 100, the clock signal 811 is then applied to a data receiver 812 along with the data from the first stack 100. In a particular embodiment the data receiver 812 may be a data flip flop that receives the data from the first stack 100 and, along with the delayed clock signal 811 from the third multiplexer 805, captures the data being sent from the first stack 100. However, any suitable type of data receiver 812 may be utilized. By inputting both the data from the first stack 100 along with the chosen clock signal from the third multiplexer 805 to the data receiver 812, the data receiver 812 can read and capture data from any of the first semiconductor device 101, the second semiconductor device 103, and the third semiconductor device 105.

However, while a particular embodiment is described which uses delay lines and data flip flops to capture data out of the separate semiconductor devices within the first stack 100, this is intended to be illustrative and is not intended to be limiting to the embodiments. Rather, any suitable input/output control protocol may be utilized. All such protocols are fully intended to be included within the scope of the embodiments.

Figure 8B:
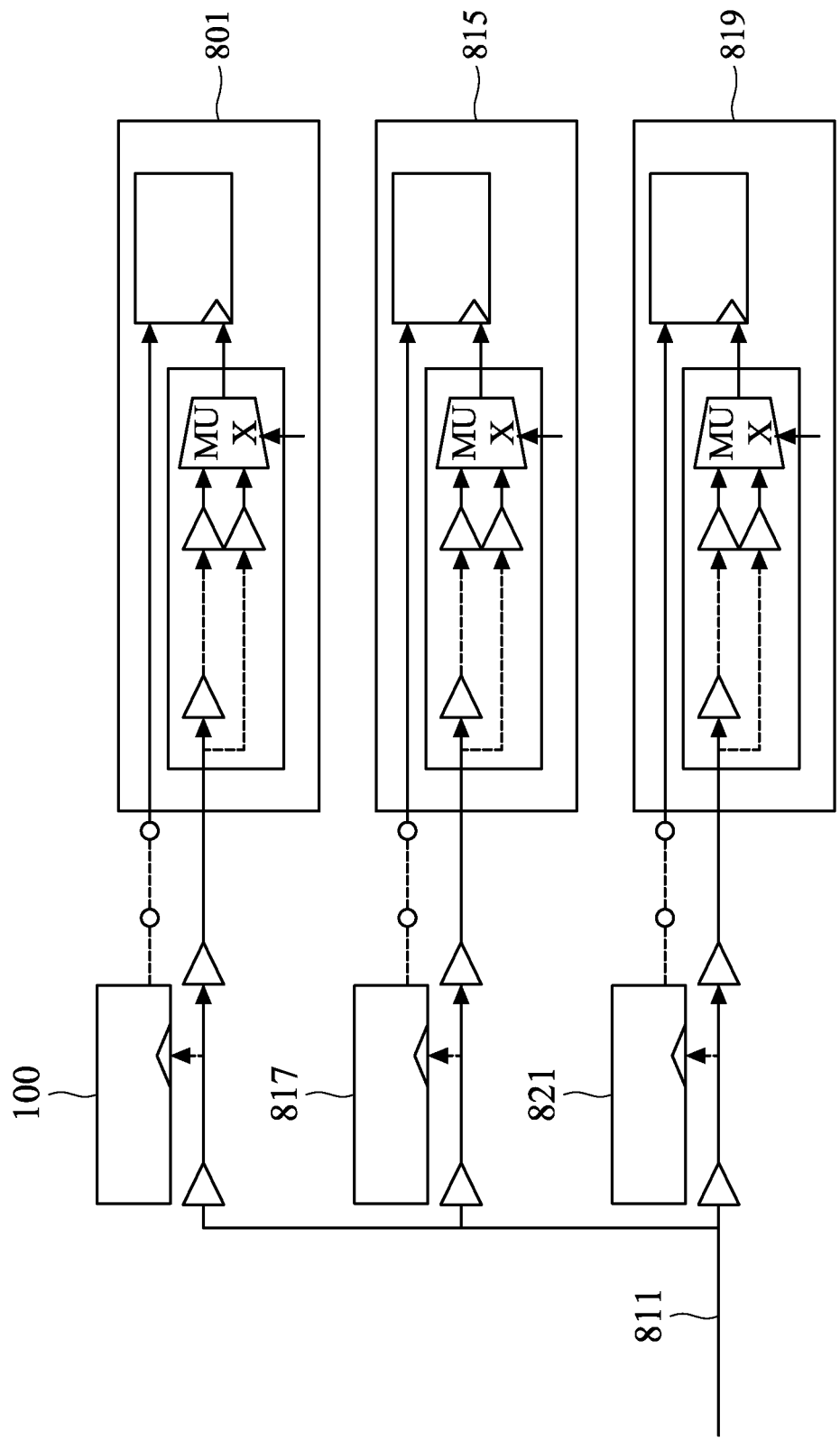

FIG. 8B illustrates another embodiment in which the first control block 801 is connected to the first stack 100, a second control block 815 is connected to a second stack 817, and a third control block 819 is connected to a third stack 821. In an embodiment the second stack 817 and the third stack 821 may be similar to the first stack 100, such as by having multiple semiconductor devices that each have a unique identifier indicating their position in the stack. Each of the second control block 815, the third control block 819, the second stack 817 and the third stack 821 may be connected to each other through, e.g., the support substrate 135, although any suitable configuration may be utilized.

Additionally, the second control block 815 and the third control block 819 may be similar to the first control block 801. For example, each of the second control block 815 and the third control block 819 may comprise multiple delay lines, a multiplexer, and a data receiver. However, any suitable structure may be utilized.

In this embodiment a single clock signal 811 may be applied to each of the first stack 100, the second stack 817, the third stack 821, the first control block 801, the second control block 815, and the third control block 819. The clock signal 811 in this embodiment may be modified based on which one of the first stack 100, the second stack 817, or the third stack 821 is desired to be read from.

For example, when data from the first stack 100 is desired to be transmitted from the first stack 100, the clock signal 811 can be set to 4 GHz (e.g., 0.25 ns). Additionally, when data from the second stack 817 is desired to be transmitted from the second stack 817, the clock signal 811 can be set to 2 GHz (e.g., 0.5 ns). Finally, when data from the third stack 821 is desired to be transmitted from the third stack 821, the clock signal can be set to 1 GHz (e.g., 1 ns). However, any suitable setting for the clock signal 811, such as the delay data stored within the table described above, the delay data related to the number of delayer elements 809, or delay data otherwise determined using, e.g., software training, can be utilized.

Given this ability to modify the clock signal 811 based on which stack is being chosen (e.g., the first stack 100, the second stack 817, or the third stack 821), faster overall data transfer speeds can be achieved. For example, if the third stack 821 requires a clock signal 811 that can be no larger than 1 GHz (e.g., the clock speed is limited by the structure, the particular node of manufacture, etc.), then the ability to modify the clock signal 811 allows the other stacks (e.g. the first stack 100 and the second stack 817) to operate at faster transfer speeds than the limiting speed of the third stack 821. Otherwise, the clock signal 811 must be set at the slowest clock speed for the worst case scenario (e.g., the limited speed of the third stack 821).

By manufacturing and operating the stack 100 as described above, an embedded ID based scalable 3D-IC chip select and fast cross-die sharing I/O structure across a heterogeneous stack of multiple semiconductor dies. As such, a scalable, flexible, low-cost solution for selecting the semiconductor dies while sharing I/O structures can be achieved with minimum of customization for a generic solution that is not dependent upon the number of semiconductor dies located within the stack and provides better performance.

FIGS. 9A-9D illustrates another embodiment which may be used to store the unique identification numbers which are assigned to each of the semiconductor devices within the first stack 100 (e.g., the first semiconductor device 101, the second semiconductor device 103, and the third semiconductor device 105). In this embodiment, rather than manufacturing the first semiconductor device 101, the second semiconductor device 103, and the third semiconductor device 105 using a different masks for the vias 307 (when the remainder of the masks used are the same), each of the first semiconductor device 101, the second semiconductor device 103, and the third semiconductor device 105 are manufactured using fully identical masks. As such, each of the first semiconductor device 101, the second semiconductor device 103, and the third semiconductor device 105 are fully identical after the manufacturing process has been completed.

In this embodiment, however, instead of a unique placement of the vias 307 being used to connect the ID lines 301 to either the high voltage source line 305 and the low voltage source line 303, fuses 901 are manufactured and then programmed in order to connect and or disconnect the ID lines 301 from the high voltage source line 305 and the low voltage source line 303. By manufacturing and then programming the fuses 901, each one of the semiconductor devices (e.g., each of the first semiconductor device 101, the second semiconductor device 103, and the third semiconductor device 105) can be manufactured in an identical fashion and the unique identifier for each of the semiconductor devices can be programmed into each of the semiconductor devices after their placement within the first stack 100 has been determined.

In the particular embodiments illustrated in FIGS. 9A-9D, a two-line (e.g., the first ID line 302 and a second ID line 304), four fuse structure may be utilized to provide up to four unique identifiers for any of the first semiconductor device 101, the second semiconductor device 103, and the third semiconductor device 105. Looking first at FIG. 9A, for example, if the binary identifier "0" is desired to be assigned, each of the fuses 901 connecting the first ID line 302 and the second ID line 304 to the high voltage source line 305 are programmed to be open and thereby disconnect both of the first ID line 302 and the second ID line 304 from the high voltage source line 305. Additionally, each of the fuses 901 connecting the first ID line 302 and the second ID line 304 to the low voltage source line 303 are programmed to be closed, thereby connecting the first ID line 302 and the second ID line 304 to the low voltage source line 303. As such, when the first ID line 302 and the second ID line 304 are read, the unique identifier of "0" is obtained.

Figure 9A:
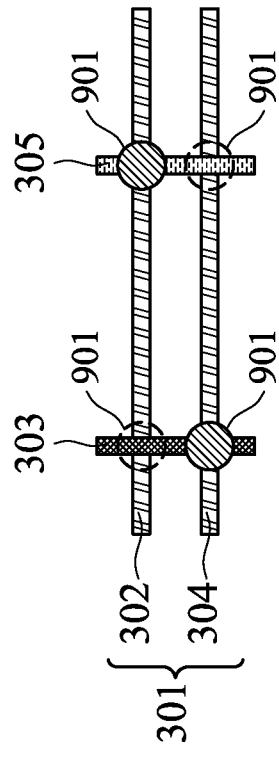
FIGS. 9A-9D illustrated views of a stored identifier block with fuses, in accordance with some embodiments.
Figure 9B:
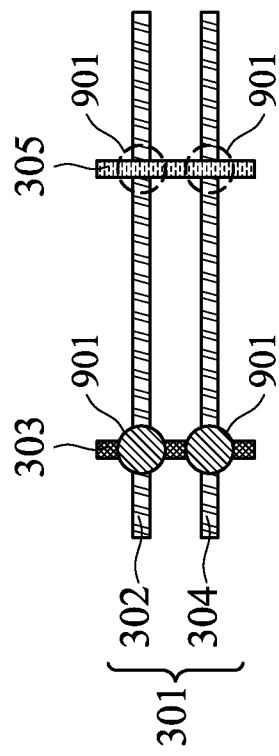

FIG. 9B illustrates another embodiment in which the fuses 901 are utilized in order to program the unique identifier of "1". In this embodiment, the fuses 901 are programed to connect the first ID line 302 to the high voltage source line 305 while disconnecting the first ID line 302 from the low voltage source line 303. Similarly, the fuses 901 are programmed to connect the second ID line 304 to the low voltage source line 303 and disconnect the second ID line 304 from the high voltage source line 305. As such, when the first ID line 302 and the second ID line 304 are read, the unique identifier of "1" is obtained.

Figure 9C:
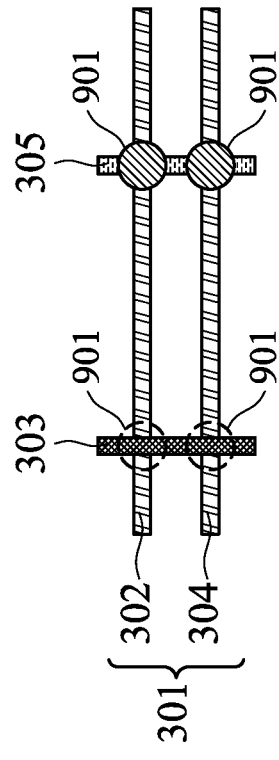

FIG. 9C illustrates another embodiment in which the fuses 901 are utilized in order to program the unique identifier of "2". In this embodiment, the fuses 901 are programed to connect the first ID line 302 to the low voltage source line 303 while disconnecting the first ID line 302 from the high voltage source line 305. Similarly, the fuses 901 are programmed to connect the second ID line 304 to the high voltage source line 305 and disconnect the second ID line 304 from the low voltage source line 303. As such, when the first ID line 302 and the second ID line 304 are read, the unique identifier of "2" is obtained.

Figure 9D:
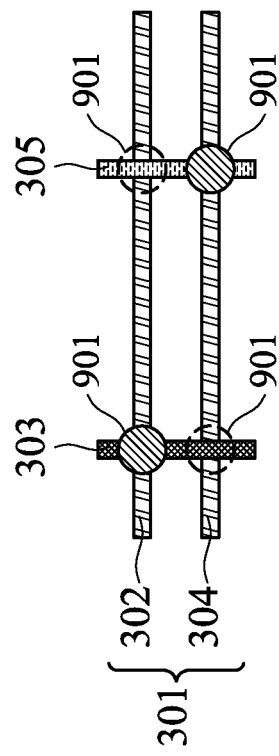

FIG. 9D illustrates yet another embodiment in which the fuses 901 are utilized in order to program the unique identifier of "3". In this embodiment, the fuses 901 are programed to connect the first ID line 302 to the high voltage source line 305 while disconnecting the first ID line 302 from the low voltage source line 303. Similarly, the fuses 901 are programmed to connect the second ID line 304 to the high voltage source line 305 and disconnect the second ID line 304 from the low voltage source line 303. As such, when the first ID line 302 and the second ID line 304 are read, the unique identifier of "3" is obtained.

Figure 10:
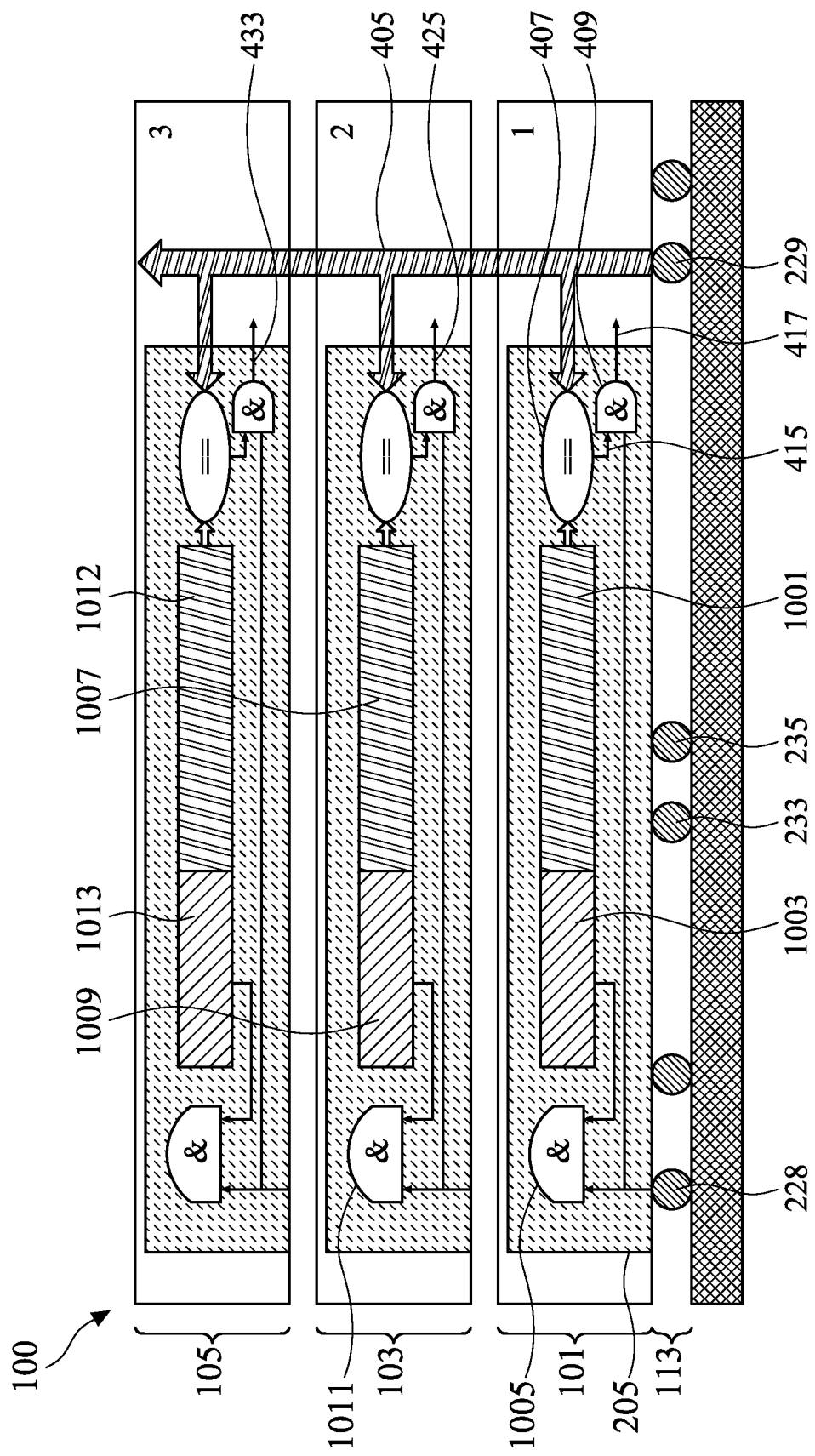
FIG. 10 illustrates a conceptual view of programming fuses, in accordance with some embodiments.

FIG. 10 illustrates an embodiment in which the fuses 901 within the first semiconductor device 101, the second semiconductor device 103, and the third semiconductor device 105 are sequentially programmed after the first semiconductor device 101, the second semiconductor device 103, and the third semiconductor device 105 are placed into the first stack 100 (e.g., in a Known Good Stack (KGS)). In a particular embodiment the first ID block 205 comprises a first fuse block 1001, wherein the first fuse block 1001 comprises a non-programmed block of fuses 901 as illustrated in FIGS. 9A-9D instead of the first via block 402 (as described above with respect to FIG. 4). Additionally, the first Stack_ID block 205 comprises the first comparator 407 and the first AND gate 409, wherein the first AND gate 409 also receives signals from the CS_ENI ball 228.

In this embodiment with the fuses 901 in the first fuse block 1001, however, additional structures are utilized to allow for a sequential programming of the fuses 901. For example, in one embodiment the first ID block 205 further comprises a first fuse done block 1003 which indicates if the programming of the first fuse block 1001 has been performed or not. Additionally, the fuse done block 1003 has an output which sends a signal to the input of a fourth AND gate 1005, the fourth AND gate 1005 also comprising another input connected to the CS_ENI ball 228.

Using this structure, when the first semiconductor device 101 is desired to be programmed, the CS_ENI ball 228 is set to "1", the default of the first fuse block 1001 is set so that the unique identifier is set to "0" and the orientation is default to, for example, a "1" wherein the "1" indicates a face-to-back orientation, and the first fuse done block 1003 has a default set to "0". By setting the CS_ENI ball 228 to "1", only the first select signal 417 is activated, while the second select signal 425 (in the second semiconductor device 103) and the third select signal 433 (in the third semiconductor device 105) are not activated. This is because the default "0" setting of the first fuse done block 1003 prevents the signal on the CS_ENI ball 228 from passing beyond the fourth AND gate 1005 and into the overlying semiconductor devices (e.g., the second semiconductor device 103 and the third semiconductor device 105).

Once the first select signal 417 of the first semiconductor device 101 has been activated, the fuses 901 within the first fuse block 1001 can be programmed. In an embodiment the fuses 901 within the first fuse block 1001 are programmed by sending programming signals through either the data in ball 233 or the data inout ball 235 and to the first fuse block 1001. For example, in some embodiments programming signals can be sent to open or close fuses in the first fuse block 1001 in order to set the unique identifier for the first fuse block 1001 to "1". However, any suitable method for programming the first semiconductor device 101 to have the unique identifier of "1" may be utilized.

Once the first fuse block 1001 of the first semiconductor device 101 has been programmed, the first fuse done block 1003 can be set to "1." In an embodiment the first fuse block 1001 can be set by sending a programming signal through a fuse or anti-fuse located within the first fuse done block 1003. However, any suitable method of setting the first fuse done block 1003 may be utilized.

However, once the first done block 1003 has been set to "1", the fourth AND gate 1005 will now send the signals from the CS_ENI ball 228 through the fourth AND gate 1005 and into the second semiconductor device 103. In an embodiment the second semiconductor device 103 comprises a second fuse block 1007, a second fuse done 1009, and a fifth AND gate 1011, wherein the second fuse block 1007, the second fuse done 1009, and the fifth AND gate 1011 are identical to the first fuse block 1001, the first fuse done block 1003, and the fourth AND gate 1005.

Once the signal from the CS_ENI ball 228 enters the second semiconductor device 103, the programming process described above with respect to the programming of the first semiconductor device 101 may be repeated for the second semiconductor device 103. In particular, with the signal from the CS_ENI ball 228 now entering the second semiconductor device 103, the second select signal 425 is activated and the fuses 901 within the second fuse block 1007 are programmed. Additionally, once the fuses 901 are programmed, the second fuse done 1009 is set to "1" and the signal from the CS_ENI ball 228 is forwarded to the third semiconductor device 105 through the fifth AND gate 1011.

Once the signal from the CS_ENI ball 228 enters the third semiconductor device 105, the programming process described above with respect to the programming of the first semiconductor device 101 may be repeated for the third semiconductor device 105. In particular, with the signal from the CS_ENI ball 228 now entering the third semiconductor device 105, the third select signal 433 is activated and the fuses 901 within the third fuse block 1012 are programmed. Additionally, once the fuses 901 are programmed, the third fuse done 1013 is set to "1" to finish the programming of the third semiconductor device 105.

Once all of the semiconductor devices in the stack have been programmed, and once all of the fuse dones have been set to "1," any group identifiers that are desired can be programmed. In an embodiment the group identifiers can be programmed simultaneously with the desired unique Group_ID. However, any suitable method of programming the semiconductor devices with the group ID can be utilized.

By utilizing the fuses 901, each of the first semiconductor device 101, the second semiconductor device 103, and the third semiconductor device 105 can be manufactured using identical structure and processes. Further, once the first semiconductor device 101, the second semiconductor device 103, and the third semiconductor device 105 have been bonded and are physically in place within the first stack 100, each one can be programmed with their respective location within the first stack 100. Such programming allows for a more efficient manufacturing process.

Additionally in this embodiment, each individual semiconductor device within the stack 100 (e.g., the first semiconductor device 101, the second semiconductor device 103, and the third semiconductor device 105) can be given its own I/O definition based not only on its location within the stack 100 but also its orientation within the stack 100, wherein the fuses 901 and unique identifiers are used to configure the I/O and the I/O definitions are related to the first external connections 113. For example, in an embodiment each of the first semiconductor device 101, the second semiconductor device 103, and the third semiconductor device 105 may be manufactured such that the first external connections 113 (e.g., a ball grid array), can be designed with either an X-symmetry, a Y-symmetry, or with complete X- and Y-symmetry.

When the first external connections 113 are symmetrical, then different orientations of face-to-back and face-to-front can be utilized using a single design, and then the orientation can be programmed during the programming of the fuses 901. In particular, in addition to the programming of the fuses 901 to add the unique identifiers, the fuses 901 can be programmed to also include the orientation of each individual semiconductor device in the stack 100. In a particular embodiment, the first semiconductor device 101 may be physically placed into the stack 100 in a face-to-back configuration, the second semiconductor device 103 may be physically placed into the stack 100 in a face-to-front configuration, and the third semiconductor device may be physically placed into the stack 100 in a face-to-back configuration. As such, during the programming of the fuses 901, the fuses 901 may include one or more fuses 901 that indicate the orientation of each of the semiconductor devices, such as the fuses 901 within the first semiconductor device 101 being programmed to indicate the first semiconductor device 101 to be in the face-to-back configuration, the fuses 901 within the second semiconductor device 103 being programmed to indicate the second semiconductor device 103 to be in the face-to-front configuration, and the fuses 901 within the third semiconductor device 105 being programmed to indicate the third semiconductor device 105 to be in the face-to-back configuration. However, any suitable configuration may be utilized.

Figure 11A:
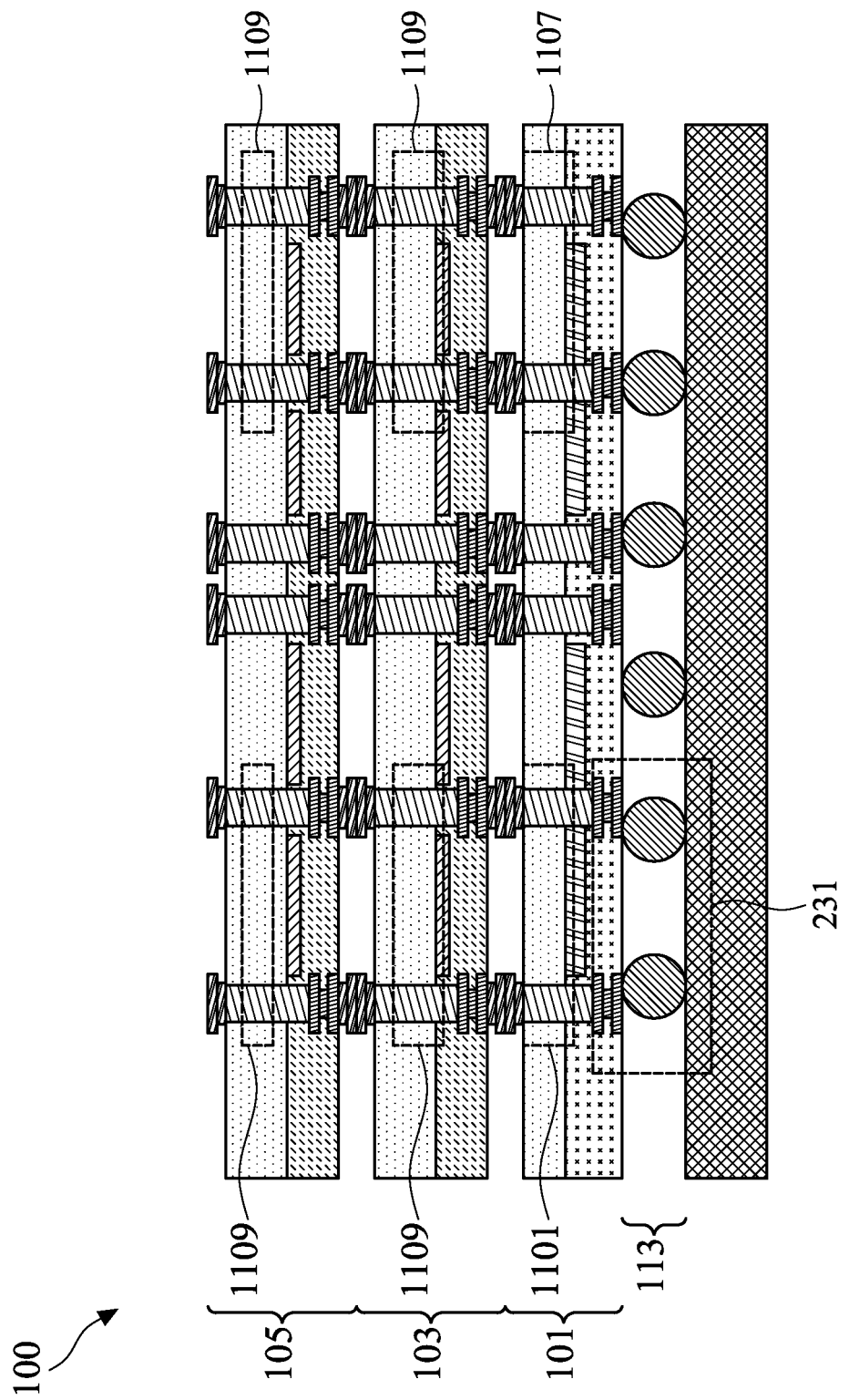
FIGS. 11A-11B illustrate an input repair circuit, in accordance with some embodiments.

FIG. 11A illustrates an optional embodiment which may be utilized in order to help repair any input paths into the first semiconductor device 101, the second semiconductor device 103, and the third semiconductor device 105 in the event that one of the input paths becomes defective. Looking first at the first semiconductor device 101, each of the data out ball 231, the data in ball 233, and the data inout ball 235, instead of comprising a single one of the first external connections 113, instead comprises a plurality of the first external connections 113. For example, and as illustrated in FIG. 11A, in a particular embodiment the data out ball 231 comprises at least four of the first external connections 113 (of which only two of the first external connections 113 are illustrated in the cross-section of FIG. 11A).

When the data out ball 231 comprises multiple ones of the first external connections 113, a first I/O multiplexer unit 1101 is additionally added to the first semiconductor device 101. In an embodiment the first I/O multiplexer unit 1101 comprises a plurality of individual I/O multiplexers 1103 (see, e.g, FIG. 11B). In an embodiment in which the data out ball 231 comprises four of the first external connections 113, the first I/O multiplexer unit 1101 comprises four of the plurality of individual I/O multiplexers 1103. However, any suitable number of the first external connections 113 and any suitable number of the plurality of individual I/O multiplexers may be utilized.

Figure 11B:
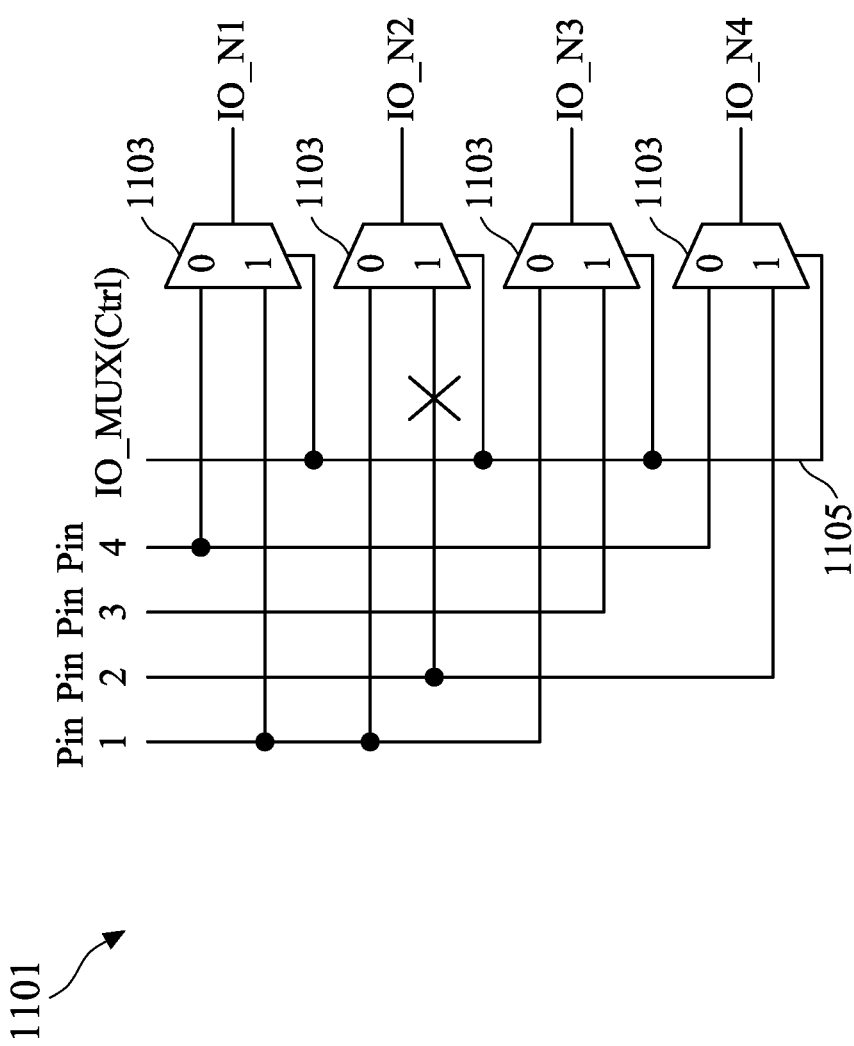

Looking now at FIG. 11B, FIG. 11B illustrates a schematic diagram of the first I/O multiplexer unit 1101. In the embodiment illustrated in FIG. 11B, each one of the plurality of individual I/O multiplexers 1103 has at least two inputs connected to at least two of the first external connections 113. For example, a first one of the plurality of individual I/O multiplexers 1103 is connected to a first one of the first external connections 113 and a second one of the first external connections 113, a second one of the plurality of individual I/O multiplexers 1103 is connected to the first one of the first external connections 113 and a third one of the first external connections 113, a third one of the plurality of individual I/O multiplexers 1103 is connected to the third one of the first external connections 113 and a fourth one of the first external connections 113, and a fourth one of the plurality of individual I/O multiplexers 1103 is connected to the second one of the first external connections 113 and the third one of the first external connections 113. However, any suitable connections between the plurality of individual I/O multiplexers 1103 and the first external connections 113 may be utilized.

Additionally, the selectors of the individual I/O multiplexers 1103 may be connected to one or more control lines 1105, which are utilized to select the output from each of the individual I/O multiplexers 1103. With the presence of the one or more control lines 1105, and because each of the individual I/O multiplexers 1103 have at least two inputs, either one of the inputs may be output by the individual I/O multiplexers 1103. As such, when one of the individual inputs (e.g., the second one of the first external connections 113) is defective (represented in FIG. 11B by the "X"), the one or more control lines 1105 can switch the corresponding individual I/O multiplexer 1103 to output a non-defective signal (e.g., the signal from the first one of the first external connections 113). As such, defects to one of the first external connections 113 may be repaired using the individual I/O multiplexers 1103.

Returning no to FIG. 11A, the first semiconductor device 101 can also comprise any number of I/O multiplexer units, such as a second I/O multiplexer unit 1107. In an embodiment the second I/O multiplexer unit 1107 is connected to multiple ones of the first external connections 113 associated with, for example, the data in ball 233, the data inout ball 235, or any other of the inputs and outputs associated with the first semiconductor device 101.

Additionally, with respect to the second semiconductor device 103 and the third semiconductor device 105, any or all of the inputs to the second semiconductor device 103 or the third semiconductor device 105 may also have multiple connections which feed into an I/O multiplexer units 1109. Each of the I/O multiplexer units 1109 may be similar to the first I/O multiplexer unit 1101, and each may be used to help repair defective connections between the second semiconductor device 103 and the third semiconductor device 105.

While the above description describes the first I/O multiplexer unit 1101 as being applied to the data out ball 231, the data in ball 233, and the data inout ball 235, this is intended to be illustrative and is not intended to be limiting. Rather, the I/O multiplexer units may be applied to any input or output signals to and from the first semiconductor device 101, the second semiconductor device 103, and the third semiconductor device 105. All such combinations are fully intended to be included within the scope of the embodiments.

Figure 12:
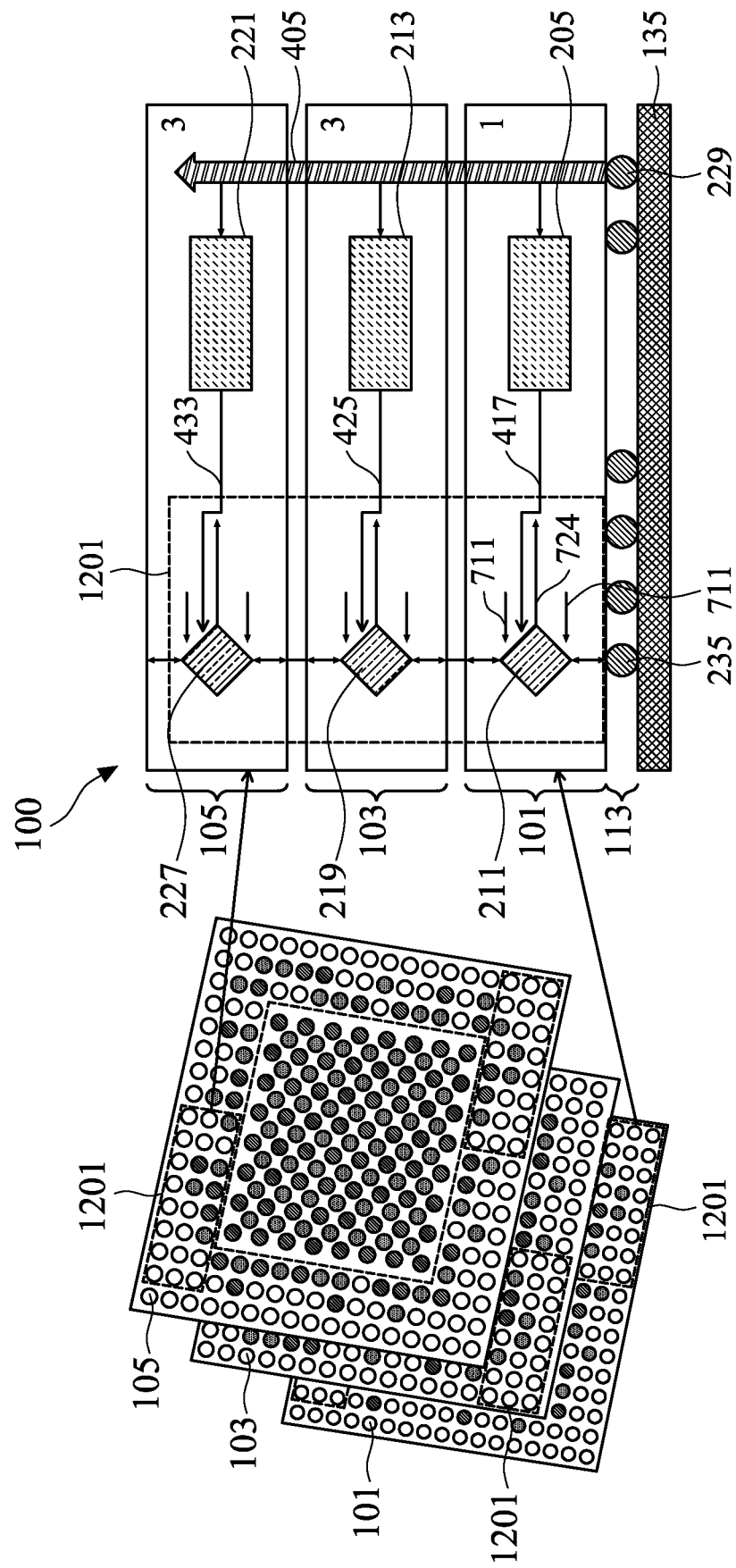
FIG. 12 illustrates an I/O array, in accordance with some embodiments.

FIG. 12 illustrates another embodiment in which the first inout block 211, the second inout block 219, and the third inout block 227, instead of being operated separately for each of the first semiconductor device 101, the second semiconductor device 103, and the third semiconductor device 105, respectively, is instead operated as an I/O array 1201, wherein portions of the I/O array 1201 are located in different regions of the semiconductor devices. For example, in embodiments in which the first semiconductor device 101, the second semiconductor device 103, and the third semiconductor device 105 are field programmable gate arrays (FPGAs), the first inout block 211, the second inout block 219, and the third inout block 227 are each manufactured with programmable gate arrays. As such, each of the first inout block 211, the second inout block 219, and the third inout block 227 can be programmed to provide different I/O communications across all of the semiconductor devices within the first stack 100.

By making the first inout block 211, the second inout block 219, and the third inout block 227 operate as an I/O array 1201, the I/O array 1201 may operate as a universal I/O array which allows for a single input or output to be shared across all of the semiconductor devices, and all for a single input to be applied across each of the first semiconductor device 101, the second semiconductor device 103, and the third semiconductor device 105. This can especially be utilized in embodiments in which the semiconductor devices are orientated in different orientations from each other (e.g., when the second semiconductor device 103 is in a different orientation than the first semiconductor device 101 and the third semiconductor device 105. As such, each groups of I/Os can be redefined by the unique identifiers for the same die, and different groups can be connected together by remapping the I/O controlled by the unique identifiers.

By utilizing the unique identifiers and input/output structures described herein, a faster input/output of data can be achieved within the stack 100 of multiple semiconductor devices. This can be achieved using a generic solation that is not dependent upon the number of semiconductor devices within the stack 100 and without having to provide a complicated customization of I/O structures that are based on the precise location of each semiconductor device within the stack 100. As such, better performance may be achieved with a low cost, generic, flexible, and scalable solution.

In an embodiment, a semiconductor device includes: a first semiconductor device including: a first unique identifier structure; a first electrical input; and a first comparator comprising a first input connected to the first unique identifier structure and comprising a second input connected to the first electrical input; a second semiconductor device bonded to the first semiconductor device, the second semiconductor device including: a second unique identifier structure different from the first unique identifier structure; a second electrical input electrically connected to the first electrical input; and a second comparator comprising a third input connected to the second unique identifier structure and comprising a fourth input connected to the second electrical input. In an embodiment, the first unique identifier structure includes: a first reference voltage line; a second reference voltage line; and a plurality of identification lines, each of the plurality of identification lines being electrically connected to one of the first reference voltage line or the second reference voltage line through one or more vias. In an embodiment, the first unique identifier structure includes: a first reference voltage line; a second reference voltage line; and a plurality of identification lines, each of the plurality of identification lines being electrically connected or isolated to one of the first reference voltage line or the second reference voltage line through one or more fuses. In an embodiment, an output from the first comparator is connected to an output region of the first semiconductor device. In an embodiment, an output from the output region is connected to a control block through a substrate, the control block comprising a plurality of delay lines. In an embodiment, the first semiconductor device further includes: a first AND gate comprising a fifth input connected to the first comparator; and a sixth input connected to an external connector of the first semiconductor device. In an embodiment, an output from the second comparator is connected to an inout region of the second semiconductor device.

In another embodiment, a semiconductor device includes: a first semiconductor die including: a first input region; a first output region; a first inout region; a first identifier region; and a first external connection electrically connected to a first comparator, the first comparator also being electrically connected to the first identifier region, an output of the first comparator being connected to both the first output region and the first inout region; and a second semiconductor die bonded to the first semiconductor die, the second semiconductor die including: a second input region; a second output region; a second inout region; a second identifier region, the second identifier region having a different structure than the first identifier region; and a second comparator electrically connected to the first external connection by a through via, wherein an output of the second comparator is connected to both the second output region and the second inout region. In an embodiment the semiconductor device further includes an AND gate located between the output of the first comparator and the first inout region. In an embodiment the first identifier region comprises fuses. In an embodiment the first identifier region includes a first set of lines in a first pattern and a first set of vias in a second pattern, and wherein the second identifier region includes a second set of lines in the first pattern and comprises a second set of vias in a third pattern different from the second pattern. In an embodiment the first output region has an input connected to an output of the second output region. In an embodiment the first inout region has an input connected to an output of the second inout region. In an embodiment the first external connection is a stack identifier connection.

In yet another embodiment, a method of sending and receiving data, the method including: sending a stack identifier signal into both a first semiconductor device and a second semiconductor device, wherein the first semiconductor device and the second semiconductor device are bonded to each other; within the first semiconductor device, comparing the stack identifier signal to a first unique identifier, wherein when the stack identifier signal is the same as the first unique identifier a first select signal is generated; and within the second semiconductor device, comparing the stack identifier signal to a second unique identifier, the second unique identifier being different from the first unique identifier, wherein when the stack identifier signal is the same as the second unique identifier a second select signal is generated, the second select signal being different from the first select signal. In an embodiment the method further includes programming the first semiconductor device by sending programming signals through fuses. In an embodiment the method further includes programming the second semiconductor device after the programming the first semiconductor device and after the first semiconductor device is bonded to the second semiconductor device. In an embodiment after the programming the first semiconductor device a programming done indicator is programmed prior to the programming the second semiconductor device. In an embodiment, prior to the sending the stack identifier signal, manufacturing the first semiconductor device with a first set of mask patterns and manufacturing the second semiconductor device with a second set of mask patterns, wherein each mask pattern within both the first set of mask patterns and the second set of mask patterns are the same except for one mask pattern. In an embodiment the one mask pattern is a pattern for vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   receiving a first semiconductor device, the first semiconductor device comprising:
      a first unique identifier structure;
      a first electrical input; and
      a first comparator comprising a first input connected to the first unique identifier structure and comprising a second input connected to the first electrical input;
      a first AND gate comprising:
         a fifth input connected to the first comparator; and
         a sixth input connected to an external connector of the first semiconductor device;
   receiving a second semiconductor device, the second semiconductor device comprising:
      a second unique identifier structure different from the first unique identifier structure;
      a second electrical input electrically connected to the first electrical input; and
      a second comparator comprising a third input connected to the second unique identifier structure and comprising a fourth input connected to the second electrical input; and bonding the first semiconductor device to the second semiconductor device.

2. The method of claim 1, further comprising receiving a third semiconductor device, the third semiconductor device comprising:
a third unique identifier structure different from the first unique identifier structure and the second unique identifier structure;
a third electrical input electrically connected to the first electrical input; and
a third comparator comprising a fifth input connected to the third unique identifier structure and comprising a sixth input connected to the third electrical input; and
bonding the third semiconductor device to the second semiconductor device.

3. The method of claim 2, further comprising programming the first semiconductor device and the second semiconductor device after the bonding.

4. The method of claim 3, wherein the programming comprises sending programming signals through fuses.

5. The method of claim 4, wherein the programming programs the first semiconductor device, the second semiconductor device, and the third semiconductor device sequentially.

6. The method of claim 1, further comprising, prior to the receiving, manufacturing the first semiconductor device with a first set of mask patterns and manufacturing the second semiconductor device with a second set of mask patterns, wherein each mask pattern within both the first set of mask patterns and the second set of mask patterns are the same except for one mask pattern.

7. The method of claim 6, further comprising, prior to the receiving, manufacturing the third semiconductor device with a third set of mask patterns, wherein each mask pattern within each of the first set of mask patterns, the second set of mask patterns, and the third set of mask patterns are the same except for one mask pattern.

8. A method of sending and receiving data, the method comprising:
receiving a first semiconductor device bonded to a second semiconductor device;
after the receiving, programming the first semiconductor device by sending programming signals through fuses;
after the receiving, programming the second semiconductor device after the programming the first semiconductor device;
after the receiving, sending a stack identifier signal into both the first semiconductor device and the second semiconductor device;
generating a first select signal when the stack identifier signal is the same as a first unique identifier within the first semiconductor device; and
generating a second select signal when the stack identifier signal is the same as a second unique identifier within the second semiconductor device.

9. The method of claim 8, wherein the receiving the first semiconductor device and the second semiconductor device further comprises receiving a third semiconductor device bonded to the second semiconductor device.

10. The method of claim 9, further comprising, after the receiving, programming the third semiconductor device after the programming the second semiconductor device.

11. The method of claim 10, further comprising generating a third select signal when the stack identifier signal is the same as a third unique identifier within the third semiconductor device.

12. The method of claim 8, wherein, prior to the receiving, manufacturing the first semiconductor device with a first set of mask patterns and manufacturing the second semiconductor device with a second set of mask patterns, wherein each mask pattern within both the first set of mask patterns and the second set of mask patterns are the same except for one mask pattern.

13. The method of claim 12, wherein the one mask pattern is a pattern for vias.

14. The method of claim 8, wherein there is no global multiplexor connected to the first semiconductor device and the second semiconductor device.

15. A method of sending and receiving data, the method comprising:
bonding a first semiconductor device to a second semiconductor device, the first semiconductor device storing a first unique identifier, then second semiconductor device storing a second unique identifier;
bonding a third semiconductor device to the second semiconductor device, the third semiconductor device storing a third unique identifier;
simultaneously sending a stack identifier signal to each of the first semiconductor device, the second semiconductor device, and the third semiconductor device, the stack identifier signal comprising the second unique identifier; and
generating a select signal within the second semiconductor device based on the stack identifier signal, wherein no select signals are generated based on the stack identifier signal within the first semiconductor device and the third semiconductor device.

16. The method of claim 15, further comprising:
simultaneously sending a second stack identifier signal to each of the first semiconductor device, the second semiconductor device, and the third semiconductor device, the second stack identifier signal comprising the first unique identifier; and
generating a second select signal within the first semiconductor device based on the second stack identifier signal, wherein no signals are generated based on the second stack identifier signal within the second semiconductor device and the third semiconductor device.

17. The method of claim 16, further comprising:
simultaneously sending a third stack identifier signal to each of the first semiconductor device, the second semiconductor device, and the third semiconductor device, the third stack identifier signal comprising the third unique identifier; and
generating a third select signal within the third semiconductor device based on the third stack identifier signal, wherein no signals are generated based on the third stack identifier signal within the first semiconductor device and the second semiconductor device.

18. The method of claim 15, further comprising, after the bonding the third semiconductor device to the second semiconductor device, programming the first semiconductor device, the second semiconductor device, and the third semiconductor device.

19. The method of claim 18, wherein the programming comprises sending programming signals through fuses.

20. The method of claim 19, wherein the programming programs the first semiconductor device prior to the second semiconductor device.

* * * * *